US010075236B2

(12) United States Patent
Baggen et al.

(10) Patent No.: US 10,075,236 B2
(45) Date of Patent: Sep. 11, 2018

(54) CODED LIGHT

(71) Applicant: PHILIPS LIGHTING HOLDING B.V., Eindhoven (NL)

(72) Inventors: Constant Paul Marie Jozef Baggen, Eindhoven (NL); Ronald Rietman, Eindhoven (NL); Paul Henricus Johannes Maria Van Voorthuisen, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 4 days.

(21) Appl. No.: 15/117,696

(22) PCT Filed: Feb. 6, 2015

(86) PCT No.: PCT/EP2015/052460
§ 371 (c)(1),
(2) Date: Aug. 9, 2016

(87) PCT Pub. No.: WO2015/121154
PCT Pub. Date: Aug. 20, 2015

(65) Prior Publication Data
US 2016/0359560 A1 Dec. 8, 2016

(30) Foreign Application Priority Data

Feb. 14, 2014 (EP) .................. 14155275

(51) Int. Cl.
*H04B 10/116* (2013.01)
*H05B 37/02* (2006.01)
(Continued)

(52) U.S. Cl.
CPC ....... *H04B 10/116* (2013.01); *H05B 37/0272* (2013.01); *H03M 5/12* (2013.01); *H03M 5/16* (2013.01); *H04L 1/08* (2013.01)

(58) Field of Classification Search
CPC ... H04B 10/116; H05B 37/0272; H03M 5/16; H03M 5/12; H04L 1/08
See application file for complete search history.

(56) References Cited

U.S. PATENT DOCUMENTS

2006/0214815 A1 9/2006 Komatsu
2012/0281987 A1 11/2012 Schenk et al.
2013/0223845 A1 8/2013 Rajagopal et al.

FOREIGN PATENT DOCUMENTS

CN 103430626 A 12/2013
EP 2503852 A1 9/2012
(Continued)

*Primary Examiner* — Leslie C Pascal

(57) ABSTRACT

A coded light signal is embedded into visible light emitted from the light source, to be received by a rolling-shutter camera which captures frames (16) by exposing a plurality of lines (18, 24) of each frame in sequence, the camera having an exposure time with each line being exposed for the exposure time. The coded light signal is formatted according to a format whereby the coded light signal comprises at least one message and the message is repeated multiple times with a timing such that, when samples of the coded light signal are obtained from a substantially smaller number of lines (24) than exposed by the camera in each frame and the message is longer than this number of lines, a different part of the message is seen by the camera in each of a plurality of different ones said frames.

19 Claims, 15 Drawing Sheets

(51) Int. Cl.
*H03M 5/16* (2006.01)
*H03M 5/12* (2006.01)
*H04L 1/08* (2006.01)

(56) References Cited

FOREIGN PATENT DOCUMENTS

| | | | |
|---|---|---|---|
| FR | 2714564 | B1 | 6/1995 |
| JP | 2007097071 | A | 4/2007 |
| JP | 2007171364 | A | 7/2007 |
| WO | 2011086501 | A1 | 7/2011 |

Plastering of messages with consecutive footprints

Plastering of messages with consecutive footprints

CODED LIGHT

CROSS-REFERENCE TO PRIOR APPLICATIONS

This application is the U.S. National Phase application under 35 U.S.C. § 371 of International Application No. PCT/EP2015/052460, filed on Feb. 6, 2015, which claims the benefit of European Patent Application No. 14155275.2, filed on Feb. 14, 2014. These applications are hereby incorporated by reference herein.

TECHNICAL FIELD

The present disclosure relates to the communication of coded light signals embedded in the light emitted by a light source.

BACKGROUND

Coded light refers to a technique whereby data is modulated into the visible illumination emitted by a light source, e.g. by an LED based luminaire. Thus in addition to providing illumination (for which purpose a light source may already be present in an environment), the light source also acts as a transmitter capable of transmitting data to a suitable receiver of coded light. The modulation is typically performed at a high enough frequency that it is imperceptible to human vision, i.e. so the user only perceives the overall illumination and not the effect of the data being modulated into that illumination. In this way the data may be said to be embedded into the light from the light source.

Coded light can be used in a number of applications. For instance, one application is to provide information from a luminaire to a remote control unit for controlling that luminaire, e.g. to provide an identifier distinguishing it amongst other such luminaires which the remote unit can control, or to provide status information on the luminaire (e.g. to report errors, warnings, temperature, operating time, etc.). In one such example, the remote control unit may comprise a mobile user terminal such as smart phone or tablet having an inbuilt camera. With the terminal running a suitable application, the user can direct the camera at a luminaire and thereby detect the identifier coded into the light from that luminaire. Given the identifier of the luminaire it is looking at, the terminal may then control that luminaire by sending back a return signal (e.g. via RF).

In another application the coded light may be used to provide information to a user, e.g. to provide identifiers of the luminaires for use in commissioning, or to enable provision of location related information. For example each luminaire in an indoor and/or outdoor environment (e.g. in the rooms and corridors of an office complex, and/or paths of a campus) may be arranged to emit light embedded with a respective identifier identifying it within that environment. If a user has a mobile terminal equipped with a camera, and an associated application for detecting coded light, the terminal can detect the identifier of a luminaire illuminating its current location. This can then be used to help the user navigate the environment, by looking up the current location in location database mapping the identifiers to locations of the luminaires. Alternatively or additionally, this may be used to look up information associated with the user's current location, such as information on exhibits in particular rooms of a museum. E.g. the look up may be performed via the Internet or a local network to which the terminal has access, or from a local database on the user terminal.

Alternatively the information could be directly coded into the light from one or more luminaires. Generally speaking, the applicability of coded light is not limited.

Data is modulated into the light by means of a technique such as amplitude keying or frequency shift keying, whereby the modulated property (e.g. amplitude of frequency) is used to represent channel symbols. The modulation typically involves a coding scheme to map data bits (sometimes referred to as user bits) onto such channel symbols. An example is a conventional Manchester code, which is a binary code whereby a user bit of value 0 is mapped onto a channel symbol in the form of a low-high pulse and a user bit of value 1 is mapped onto a channel symbol in the form of a high-low pulse. Another example is the recently developed Ternary Manchester code, described in international patent application publication no. WO2012/052935.

Ternary Manchester now forms a part of the state of the art and is thus known to skilled person, but it is summarized again here for completeness. At the transmitter, each data bit to be transmitted is mapped to a channel symbol in the form of a respective unit pulse. According to this scheme, there are two possible units, in the form of positive and negative "hat" functions as shown in FIG. 5. The pulse mapped to a data bit of value 1 is shown on the left hand side of FIG. 5, and the pulse mapped to a data bit of value 0 is shown on the right hand side of FIG. 5. A data bit is a bit of actual information to be transmitted, sometimes referred to as "user data" (even if not explicitly created by a user). The data bit period is labeled $T_D$ in FIG. 5, with the boundaries between user bit periods shown with vertical dashed lines.

Each unit pulse comprises a sequence of elementary channel periods of length $T_C$ in time, smaller than the data bit period. Each elementary channel period conveys just one of the elementary levels that the coded signal can take (one ternary Manchester symbol), and is not alone sufficient to convey data without being modulated into a composite channel symbol. Hence each pulse of length $T_D$ is the smallest or most fundamental unit of information content that can be conveyed using the coding scheme in question.

In the ternary Manchester code, each unit hat function comprises a sequence of three elementary channel periods of length $T_C$ in time, each half the length of the data bit period $T_D$ ($T_D = 2T_C$). The three elementary periods for a respective data bit are contiguous, with the middle of the three being located at the center of the respective data bit period, so that the adjacent first and third elementary channel periods straddle the beginning and end boundaries of the data bit period respectively by half an elementary channel period $T_C$ either side.

For a data bit of value 1, this is mapped to the positive hat function shown on the left of FIG. 5. The positive hat function comprises: a first elementary channel period of height $-\frac{1}{2}$ centered on the beginning (earlier) boundary of the respective data bit period, followed by second (middle) elementary channel period of height +1 being centered on the respective data bit period, followed by a third elementary channel symbol of height $-\frac{1}{2}$ centered on the end (later) boundary of the respective data bit period. The "height" at this stage may be represented in any suitable terms such as a dimensionless digital value (ultimately to be represented by the modulated signal property, e.g. amplitude or frequency).

For a data bit of value 0, this is mapped to the negative hat function shown on the right of FIG. 5. The negative hat function comprises: a first elementary channel period of height $+\frac{1}{2}$ centered on the beginning (earlier) boundary of the respective data bit period, followed by second (middle) elementary channel period of height −1 being centered on the respective data bit period, followed by a third elementary channel period of height +½ centered on the end (later) boundary of the respective data bit period.

To create the coded bit stream to be transmitted, the hat functions of adjacent user bits are added to one another, offset by the times of their respective bit periods. Because the hat functions overlap across the boundaries between data bit periods, the functions add in the overlapping regions between adjacent data bits. That is, the hat functions are joined along the boundaries, so the earlier boundary $A_n$ of one data bit period is joined with the later bit boundary $A_{n+1}$ of the preceding adjacent data bit period, with the height of the signal being summed where the two adjacent pulses overlap. An example of a resulting sequence of channel symbols in the time domain is shown in FIG. 6.

Where two adjacent data bits are of value 1, this means the two overlapping elementary channel periods of height −½ add to a height of −1. Where two adjacent data bits are of value 0, the two overlapping elementary channel periods of height +½ add to height +1. Where two adjacent data bits are of different values, the two overlapping elementary channel periods of height +½ and −½ add to 0. Thus in the coded stream, each user bit period (each unit pulse) takes the form of either a positive pulse of a rectangular wave when a user bit of value 1 is sandwiched between two adjacent user bits of value 1, or a negative pulse of a rectangular wave when a user bit of value 0 is sandwiched between two adjacent user bits of value 0, or an uneven pulse of one or four possible configurations with straight edges when at least one of the adjacent user bits is different.

In an equivalent variant, the mapping of data bit values 0 and 1 to positive and negative hat functions may be reversed.

The resulting signal (e.g. that of FIG. 6) is then converted into a variation in the modulated property of the signal output by the transmitting light source (e.g. whether represented in terms of amplitude or frequency). For example, elementary channel symbol −1 may be represented by a low light output level, the elementary channel symbol +1 may be represented by a high output light level, and the elementary channel symbol 0 may be represented by an intermediate light level between the high and low.

The ternary Manchester code can be advantageous as it provides a smoother transition when the data bits change value than a conventional Manchester code, and results in a spectrum in the frequency domain that is more suppressed around low frequencies where interference such as mains hum may occur. However, the applicability of the present disclosure is not limited to ternary Manchester and in other embodiments other examples of suitable coding schemes may be used, e.g. a conventional (binary) Manchester code, or other conventional binary or ternary lines codes.

There is a growing interest in using coded light in applications where the light from a light source is to be captured using a rolling shutter camera, such as the cheap cameras often found in mobile phone devices. A rolling shutter camera scans the lines of the image one at a time, line-by-line (typically at a minimum of 18 k lines/s). As the lines are recorded time-sequentially, and the codes in the light may also vary time-sequentially, additional processing is involved. Typically the samples on a line are "integrated" or "condensed" into a single value per line. Each line thus captures a sample of the signal at a different moment in time, enabling the coded light signal to be reconstructed.

SUMMARY

According to one aspect disclosed herein, there may be provided a device comprising: a driver for controlling a light source based on a controller output to embed a coded light signal into visible light emitted from the light source, and a controller configured to generate the coded light signal. The light is to be received by a rolling-shutter camera which captures frames by exposing a plurality of lines of each frame in sequence, the camera exposing each line for a predetermined time. The controller is configured to generate the controller output to generate the coded light signal according to a format whereby the coded light signal comprises at least one message and the message is repeated multiple times with a timing such that, when samples of the coded light signal are obtained from a substantially smaller number of said lines than exposed by the camera in each frame and the message is longer than said number of lines, a different part of the message is seen by the camera in each of a plurality of different ones said frames.

In embodiments, the message may be repeated such that the whole message will be seen over said plurality of frames.

The message may be of a duration longer than one frame.

The message may comprise one or more packets comprising different data content, wherein each of the packets of the message may be followed by an inter-packet idle period, and wherein the repetitions of the message may be separated by an inter-message idle period different than the inter-packet idle period.

The inter-packet idle period may be greater than or equal to the exposure time or a maximum anticipated value of the exposure time.

The inter-message idle period may be selected to obtain said timing whereby a different part of the message is seen by the camera in each of a plurality of different ones said frames.

The exposure time may be less than or equal to (1/30)s, less than or equal to (1/60)s, or less than or equal to (1/120)s.

The at least one message may be formed of at least three packets per message.

Each of the packets may be of a length less than or equal to 17 bits long, less than or equal to 12 bits long, or less than or equal to 9 bits long.

The packet length may be 9 bits, consisting of a byte of content and a synchronization bit.

The controller may be configured to encode the coded light signal according to a ternary Manchester modulation coding scheme whereby data bits of the signal are represented by being mapped to ternary Manchester symbols.

The inter-message idle period may have a duration of at least 4 of said symbols.

Each of the packets may be 19 of said symbols long, the inter-packet idle period may have a duration of 33 of said symbols, and the inter-message idle period may have a duration of 5 of said symbols.

The controller may be configured to encode the coded light signal with a symbol rate of said symbols being 1 kHz, 2 kHz or 4 kHz.

The controller may be configured to receive an indication of the exposure time from the camera via a back channel, and to adapt the format of the message based on the exposure time.

The controller may be configured to perform said adaptation by selecting one of more parameters such that a different part of the message is seen by the camera in each of a plurality of different ones said frames, and the one or more parameters may comprise: the inter-packet idle period, inter-message idle period, number of packets per message, and/or symbol rate.

The controller may be configured to adapt the format by selecting between a plurality of different predetermined combinations of said parameters.

Said number of lines may be less than or equal to 14% of the lines of each frame.

According to a further aspect disclosed herein, there may be provided a system comprising the device having any of the above features, the light source, and the camera; the camera being positioned relative to the light source such that said samples are obtained from the substantially smaller number of lines than exposed by the camera in each frame and the message is longer than said number of lines.

According to a further aspect disclosed herein, there may be provided a method comprising: controlling a light source to embed a coded light signal into visible light emitted from the light source, the coded light signal comprising at least one message; receiving the light at a rolling-shutter camera which captures frames by exposing a plurality of lines of each frame in sequence, the camera exposing each line for a predetermined time; and obtaining samples of the coded light signal from a substantially smaller number of said lines than exposed by the camera in each frame, the message being longer than said number of lines; wherein the coded light signal is generated according to a format whereby the message is repeated multiple times with a timing such that a different part of the message is seen by the camera in each of a plurality of different ones said frames.

According to a further aspect disclosed herein, there may be provided a computer program product comprising code embodied on a computer-readable storage medium and configured so as when executed to perform operations of: controlling a light source based on a controller output to a driver (8) to embed a coded light signal into visible light emitted from the light source, to be received by a rolling-shutter camera which captures frames by exposing a plurality of lines of each frame in sequence, the camera exposing each line for a predetermined time having an exposure time with each line being exposed for the exposure time; and generating the control output for out to the driver to generate the coded light signal according to a format whereby the coded light signal comprises at least one message and the message is repeated multiple times with a timing such that, when samples of the coded light signal are obtained from a substantially smaller number of lines than exposed by the camera in each frame and the message is longer than said number of lines, a different part of the message is seen by the camera in each of a plurality of different ones said frames.

According to a further aspect disclosed herein, there may be provided a coded light signal embedded into visible light emitted from the light source, to be received by a rolling-shutter camera which captures frames by exposing a plurality of lines of each frame in sequence, the camera exposing each line for a predetermined time; wherein: the coded light signal is formatted according to a format whereby the coded light signal comprises at least one message and the message is repeated multiple times with a timing such that, when samples of the coded light signal are obtained from a substantially smaller number of lines than exposed by the camera in each frame and the message is longer than said number of lines, a different part of the message is seen by the camera in each of a plurality of different ones said frames.

In embodiments the method, computer program and/or signal may be further configured in accordance with any of the features discussed in relation to the device above.

According to another aspect disclosed herein, there may be provided device a comprising: an input for receiving a signal from a rolling-shutter camera which captures frames of a given duration at a given frame rate by exposing a plurality of lines of each frame in sequence, the signal comprising a coded light signal; and a signal processing module arranged to obtain a respective sample of the coded light signal from each of a number of said lines, being a substantially smaller number of said lines than exposed by the camera in each frame. The coded light signal comprises a message having a duration longer than said number of lines, and the message is repeated multiple times with a timing such that a different part of the message is seen by the camera in each of a plurality of different ones said frames. The signal processing module is configured to time align the different parts of the message from the plurality of different frames, and reassemble the message from the time-aligned parts.

In embodiments, the whole message may be seen over said plurality of frames.

In embodiments, the message may have a duration longer than one frame.

In embodiments, the signal processing module may be configured to perform said time-alignment based on the frame duration and message duration.

In embodiments, the signal processing module may be configured to perform said time-alignment by: determining a timing reference period that is an integer multiple of the length of said message; and offsetting the part of the message received in each successive frame by the frame length with respect to its preceding frame, but wrapping around to the beginning of said timing reference period beyond the end of said timing reference period.

In embodiments the signal processing module may be configured to obtain a respective sample from each of a plurality of active lines of each frame including said number of lines, thereby producing a frame signal having said frame duration; and the offsetting is performed by extending each frame signal to have the duration of the timing reference period.

Said extending may be performed by adding zeros to the frame signal.

The signal processing module may be configured to discard one or more skipped frames.

The signal processing module may be configured to generate a plurality of reassembled versions of the message each based on a different respective subset of said message parts, and to perform a synchronization between a clock of said device and a clocking of said coded light signal based on a correlation between said versions of the message.

Each of said samples may be taken by combining pixel values of the respective line.

Said number of lines may be less than or equal to 14% of the lines of each frame.

Each of said parts may be less than or equal to 3% of the message.

The number of lines from which said samples are obtained may exclude lines comprising one or more pixels that are over exposed.

According to a further aspect disclosed herein, there may be provided a receiver comprising the device having any of the above features, and the camera.

According to a further aspect disclosed herein, there may be provided a system comprising the receiver, and the light source; the camera being positioned relative to the light source such that said samples are obtained from the substantially smaller number of lines than exposed by the camera in each frame and the message is longer than said number of lines.

According to another aspect disclosed herein, there may be provided a method comprising: receiving a signal from a rolling-shutter camera which captures frames by exposing a plurality of lines of each frame in sequence, the signal comprising a coded light signal; and obtaining a respective sample of the coded light signal from each of a number of said lines, being a substantially smaller number of said lines than exposed by the camera in each frame; wherein the coded light signal comprises a message having a duration longer than said number of lines, and the message is repeated multiple times with a timing such that a different part of the message is seen by the camera in each of a plurality of different ones said frames; and wherein the method further comprises time aligning the different parts of the message from the plurality of different frames, and reassembling the message from the time-aligned parts.

According to another aspect disclosed herein, there may be provided a computer program product embodied on a computer-readable medium and configured so as when executed to perform operations of: receiving a signal from a rolling-shutter camera which captures frames by exposing a plurality of lines of each frame in sequence, the signal comprising a coded light signal; and obtaining a respective sample of the coded light signal from each of a number of said lines, being a substantially smaller number of said lines than exposed by the camera in each frame; wherein the coded light signal comprises a message having a duration longer than said number of lines, and the message is repeated multiple times with a timing such that a different part of the message is seen by the camera in each of a plurality of different ones said frames; and wherein the code is further configured so as when executed to time align the different parts of the message from the plurality of different frames, and to reassemble the message from the time-aligned parts.

In embodiments the method and/or computer program may be further configured in accordance with any of the features discussed in relation to the device above.

According to yet another aspect disclosed herein, there may be provided a Wiener filter for equalizing an effect of a first filter on an input signal which is subject to the first filter and to noise and/or interference, wherein: the first filter is dependent on at least one unknown quantity; and the Wiener filter is configured based on an averaged representation of the first filter averaged over said at least one unknown quantity, in place of a representation of the first filter being assumed to be known.

In embodiments, said averaged representation may comprise an average of the conjugate of the first filter.

Said averaged representation may comprise an average of: the first filter multiplied by its conjugate.

Said averaged representation may comprise an average of the conjugate of the first filter and an average of: the first filter multiplied by its conjugate.

The Wiener filter may operate in a frequency domain.

The Wiener filter may be configured according to:

$$G = \frac{E_\theta[H^*] \cdot S}{E_\theta[HH^*] \cdot S + N_0}$$

where G is the Wiener filter in the frequency domain, H is the first filter in the frequency domain, S is a spectral density of the input signal, $N_0$ is a spectral density of the noise and/or interference, $\theta$ is the unknown quantity, and E is the average with respect to $\theta$.

The average may assume a uniform distribution of the unknown quantity between finite limits.

The first filter may have a nominal value, and said averaging with respect to the unknown quantity may be computed using a Tailor series expansion of the first filter around its nominal value and a first plurality moments of the unknown quantity.

The first filter may be dependent on a plurality of unknown quantities, and the Wiener filter may be configured based on an averaged representation of the first filter averaged over each of said unknown quantities.

The first filter may comprise a box function in the time domain and a sinc function in the frequency domain, the box function having a width in the time domain, and said unknown quantity may comprise the width of the box function.

The input signal may comprise a coded light signal captured by a rolling shutter acquisition process whereby each line of a frame is exposed in turn for an exposure time, and said filter may be a result of the rolling shutter acquisition process with the exposure time being said unknown quantity.

The exposure of each line may produce the box function, and its width may be the exposure time.

The first filter may comprise a band pass filter having a center frequency and band width, and said at least one unknown quantity may comprise the center frequency and/or band width of the band pass filter.

According to a further aspect disclosed herein, there may be provided a receiver comprising the Weiner filter having any of the above features, and the camera which may be arranged to capture said input signal by said rolling shutter acquisition process.

According to a further aspect disclosed herein, there may be provided a method of determining a Wiener filter for equalizing an effect of a first filter on an input signal which is subject to the first filter and to noise and/or interference, the method comprising: identifying at least one unknown quantity upon which the first filter is dependent; and in a formulation of a Wiener filter comprising a representation of the first filter, in place of a representation in which the first filter is assumed to be known, replacing the representation with an averaged representation of the first filter averaged over said at least one unknown quantity.

According to a further aspect disclosed herein, there may be provided a computer program product embodied on a computer-readable medium, and configured so as when executed to implement a Wiener filter for equalizing an effect of a first filter on an input signal which is subject to the first filter and to noise and/or interference, wherein: the first filter is dependent on at least one unknown quantity; and the Wiener filter is configured based on an averaged representation of the first filter averaged over said at least one unknown quantity, in place of a representation of the first filter being assumed to be known.

In embodiments the method and/or computer program may be further configured in accordance with any of the features discussed in relation to the Wiener filter above.

In further embodiments, any of the features of the transmit-side device, receive side device and/or Wiener filter set out above may be combined; as may any features of any device, transmitter, receiver, system, signal, method and/or computer program set out above or disclosed elsewhere herein.

Note that this Summary section is not intended to limit the scope of the present disclosure. The scope of the disclosure is limited only by the claims.

BRIEF DESCRIPTION OF THE DRAWINGS

To assist understanding of the present disclosure and to show how embodiments may be put into effect, reference is made by way of example to the accompanying drawings in which.

DETAILED DESCRIPTION OF EMBODIMENTS

The following relates to a coded light application, and provides a format for transmitting coded light, a decoder for receiving the coded light, and one particular advantageous building block used in the decoder (which can also be used in other applications other than coded light).

The format and decoding techniques are aimed at providing a practical solution for coded light, defining a format that can work with existing rolling-shutter cameras as well as dedicated so-called region-of-interest (ROI) cameras alike. The disclosure provides a method of encoding and decoding, an encoder and decoder, a signal format, and software for encoding and decoding, that in embodiments allow such cheap rolling shutter cameras to receive coded light and to decode the messages contained therein.

Cheap rolling shutter cameras effectively scan their images, so the lines progress, so does time. This implies that the timestamp of the top line is much earlier than the timestamp of the bottom line. Now imagine that coded light is present in the image—the coded light will typically only be visible in a small section of the image.

The lines that actually image the light are the lines that contain coded light. Each line is "condensed" into a single value and that single value corresponds with a bit of information or a symbol; that is the bit or symbol transmitted at the moment in time that the line was scanned. Now for the rolling shutter camera to decode a message, one could make sure that the number of lines per frame is high enough (so the light big enough) and decode images based on a single frame. However, as will be discussed in more detail shortly, that is not always possible.

Figure 1:
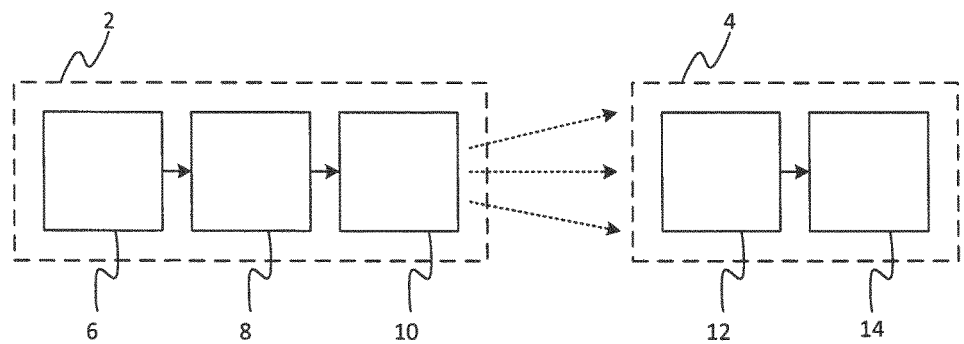
FIG. 1 is a schematic block diagram of a coded light communication system.

FIG. 1 gives a schematic overview of a system for transmitting and receiving coded light. The system comprises a transmitter 2 and a receiver 4. For example the transmitter 2 may take the form of a luminaire (e.g. mounted on the ceiling or wall of a room, a free-standing lamp, or an outdoor light pole); and the receiver 4 may take the form of a mobile user terminal such as a smart phone, tablet or laptop computer. The transmitter 2 comprises a light source 10 and a driver 8 connected to the light source 10. The transmitter 2 also comprises a device in the form of a controller 6 and an output to the driver 8, for controlling the light source 10 to be driven via the driver 8. For example the controller 6 may take the form of software stored on a memory of the transmitter 2 and arranged for execution on a processor of the transmitter, or alternatively it is not excluded that some or all of the controller 6 could be implemented in hardware, or configurable or reconfigurable hardware circuitry. The receiver 4 comprises a camera 12 and a device in the form of a signal processing module 14 and input from the camera 12. The signal processing module 14 may for example take the form of software stored on a memory of the receiver 4 and arranged for execution on a processor of the receiver 4, or alternatively it is not excluded that some or all of the signal processing module 14 could be implemented in dedicated hardware circuitry, or configurable or reconfigurable hardware circuitry. The controller 6 and signal processing module 14 are configured to perform transmit-side and receive side operations (respectively) in accordance with embodiments disclosed herein.

Figure 2:
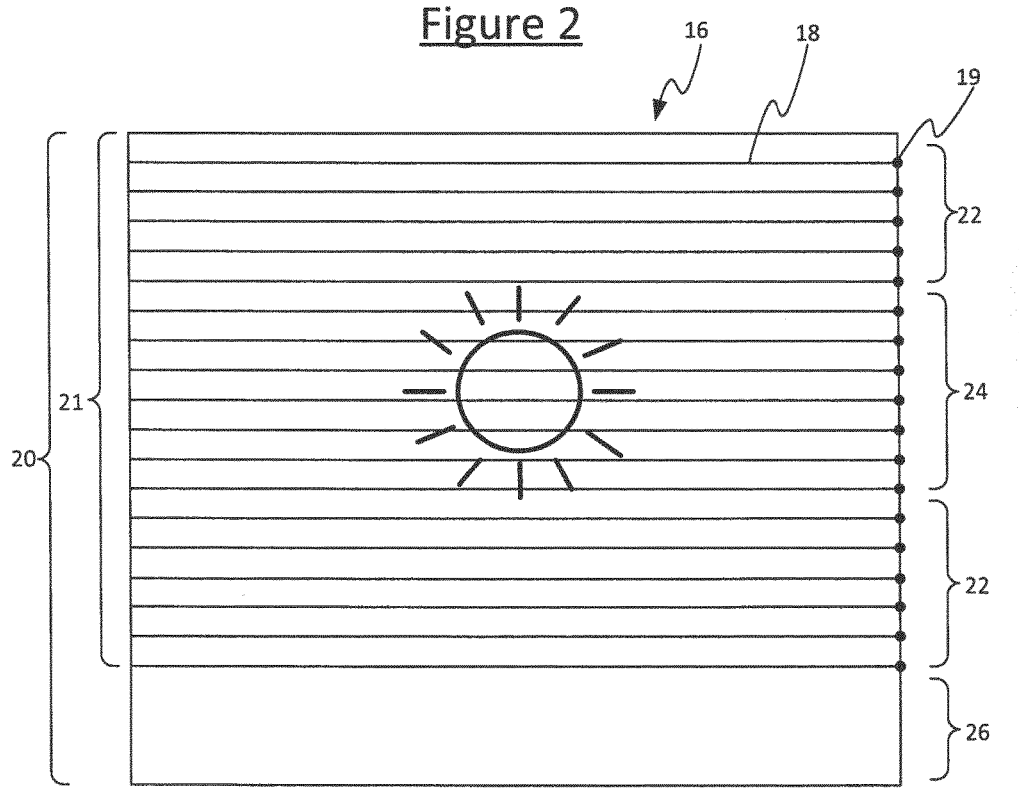
FIG. 2 is a schematic representation of a frame captured by a rolling shutter camera.
Figure 3:
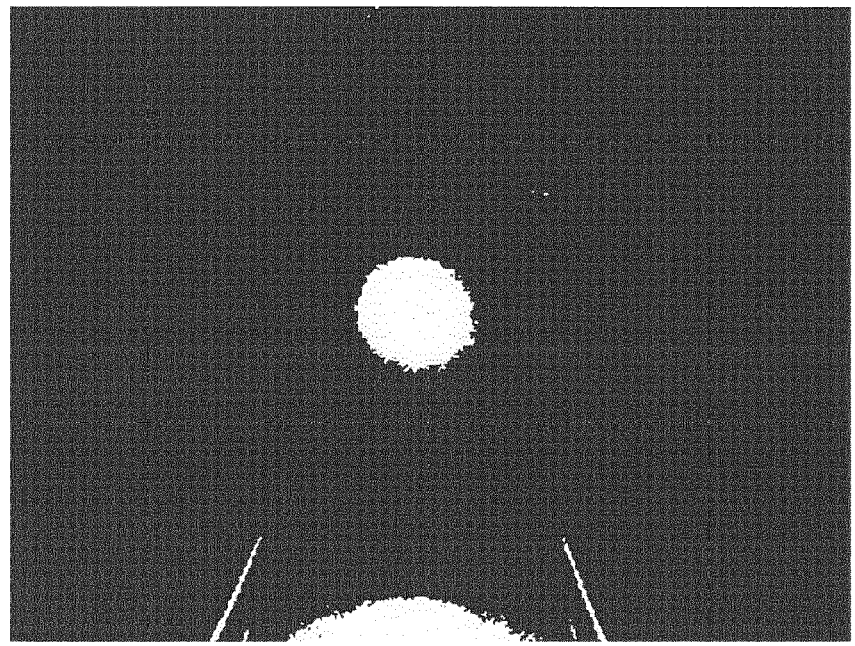
FIG. 3 shows an example of a captured frame.

Referring to FIGS. 2 and 3, the camera 12 is arranged to capture a series of frames 16, which if the camera is pointed towards the light source 10 will contain an image of light from the light source 10. The camera 12 is a rolling shutter camera, which means it captures each frame 16 not all at once (as in a global shutter camera), but by line-by-line in a sequence of lines 18. That is, each frame 16 is divided into a plurality of lines 18 (total number of lines labeled 20), typically horizontal lines, each spanning across the frame 16 and being one or more pixels thick (e.g. spanning the width of the frame 16 and being one or more pixels high in the case of horizontal lines). The capture process begins by exposing one line 18, then the next (typically an adjacent line), then the next, and so forth. For example the capturing process may roll top-to-bottom of the frame 16, starting by exposing the top line, then next line from top, then the next line down, and so forth. Alternatively it could roll bottom-to-top (or even in vertical lines side to side). Note that the exposures of each line may be exclusive in time, or alternatively may overlap in time (but either way begin at different times). The camera 12 has a certain exposure time Texp, and each line is exposed in turn for an instance of this same exposure time. Note also that in the case of digital cameras, "exposure" does not mean in the sense of a mechanical shutter, but rather the time for which the pixels of the line are capturing or sampling the light.

To capture a sample for the purpose of detecting coded light, some or all of the individual pixels samples of each given line 18 are combined into a respective combined sample 19 for that line (e.g. only the "active" pixels that usefully contribute to the coded light signal, to be discussed later with reference to FIGS. 3 and 4). For instance the combination may be performed by integrating or averaging the pixel values, or by any other combination technique. Alternatively a certain pixel could be taken as representative of each line.

In the existing literature it is assumed that the source 10 covers all or almost all of every frame. However this is often not the case. Moreover the light being emitted is not necessarily synchronized with the capturing process which can result in further problems.

A particular problem in using a rolling shutter camera for coded light detection therefore arises, because the light source 10 serving as a coded light transmitter may in fact cover only a fraction of the lines 18 of each frame 16. Actually, only the lines 24 in FIG. 2 contain pixels that record the intensity variations of the coded light source and thus lead to samples containing useful information. See also FIG. 3. All the remaining "lines per frame" 22 and their derived samples do not contain coded light information related to the source 10 of interest. If the source 10 is small, one may only obtain a short temporal view of the coded light source 10 in each frame 16 and therefore the existing techniques only allow for very short messages. However, it may be desirable to have the possibility of also transmitting longer messages. Note also that there may be some lines 26 that are "hidden" or inactive, e.g. due to a selected frame format (leaving only active lines 21 contributing to the captured image).

Apart from the above there may alternatively or additionally be one or more other problems. In embodiments problems may comprise: firstly, a rolling shutter may result in short temporal-interrupted views of the coded light source; secondly, there may be a conflict of interest between "automatic exposure control" and coded light; thirdly, driver technology at present allows only low frequency signaling which may cause flicker; and/or fourthly, the filtering effect produced by the rolling shutter process may result in inter-symbol interference (ISI).

Therefore existing techniques may be insufficiently flexible and/or prone to error or interference. The following embodiments aim to combine information from multiple video frames in a rolling shutter camera, such that messages longer than their footprint in a single video frame can be captured and decoded. In embodiments this involves:
(i) use of a signal format whereby a message is cyclically repeated by the transmitter; and
(ii) at the receiver, exploiting the knowledge of the repetition time of the message (Tm) and the knowledge of the frame duration (Tframe) for reconstructing a complete message from the partial snapshots obtained in each frame. To this end the disclosure provides a method to collect and reassemble the data collected from multiple frames.

A message is cyclically repeated, and at the receiver the message is effectively re-assembled over time (e.g. this can for certain messages actually take 1 or 2 seconds, e.g. so 30-60 frames). In order to enable this, the following describes a particular data format for encoding information in the light.

Part of the decoding of the signal in turn is described using a method referred to herein as "reassembly". To facilitate the decoding, the message duration and/or the Texp of the camera are tweaked in a manner that enables a cheap rolling shutter camera to detect a complete message fairly quickly.

Once the message is re-assembled it will be equalized. The "normal" approach is to take the message and to effectively use a slicer to determine the exact timing of the signal and then equalize it. However, according to embodiments of the following, this can be achieved in a smart manner using a robust Wiener filter implementation that is rather efficient (preferably such that the entire decoding algorithm can be implemented on standard run-of-the-mill mobile phones).

The robust Wiener filter takes into consideration the uncertainty of the channel and in this manner can reduce the inter-symbol interference (ISI). In the following embodiments this filter is used following re-assembly, but note that it may be used in other systems as well (not limited just to equalizing the effect of a rolling-shutter nor even just to coded light applications).

Message Format

The following describes a message format that allows for a reliable combination of the information of multiple video frames such that messages longer than the "footprint", and even messages having a duration of many frames can be captured and decoded. Moreover, the signal format allows for asynchronous (Wiener-like) equalization to undo the ISI caused by the camera at the receiver. Further, the frequency content of the messages can be such that there is no visible flicker or stroboscopic effects, even for message lengths having a repetition frequency of, e.g., 18 Hz (very sensitive flicker frequency).

Figure 7:
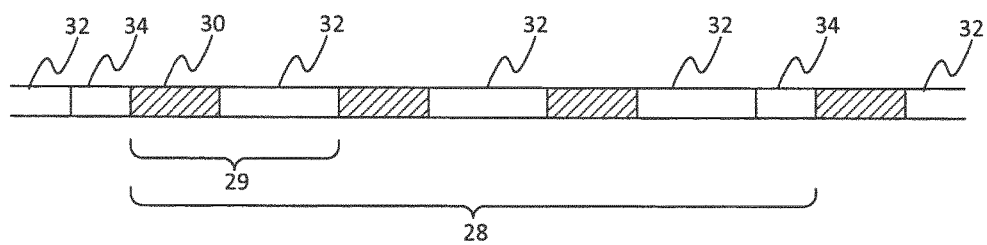

An example of such a message format is shown in FIG. 7. To ensure the message can be captured even given a small footprint, the coded light signal is transmitted according to a format whereby the same message 28 is repeated multiple times in succession, and the timing of this is configured relative to the exposure time of the camera—or the range of possible exposure times of anticipated cameras—such that the message "rolls" over multiple frames. That is, such that a different part of the message is seen by the camera in each of a plurality of different frames, in a manner that allows the full message to be built up over time as different parts of the message are seen. The issue here is therefore the manner in which the message length (duration) Tm is chosen relative to the exposure time Texp or anticipated exposure times, such that in reconstruction the rolling shutter camera images another part of the message in every frame (wherein the parts of the message are not necessarily consecutive, and in fact for rolling shutter cameras they will often not be consecutive). The message timing may be adapted in response to actual knowledge of a particular camera's exposure Texp being fed back via a suitable back channel such as an RF channel between receiver 4 and transmitter 2 (a "negotiated format"), or alternatively the timing may be formatted in a predetermined fashion to anticipate a range of possible exposure times values Texp of cameras the format is designed to accommodate (a "universal format").

In embodiments, aside from the length (duration) of the message's actual data content (payload) 30, the message length Tm may be selected by including an inter-message idle period (IMIP) 34 between repeated instances of the same message. That way, even if the message content alone would result in each frame seeing more-or-less the same part of the message, the inter-message idle period can be used to break this behavior and instead achieve the "rolling" condition discussed above. In embodiments the inter-message idle period may be adapted given feedback of Texp ("negotiated format"), or may be predetermined to accommodate a range of possible values of Texp ("universal format").

As mentioned, the rolling condition is linked to the exposure time (i.e. line exposure time) Texp of the rolling-shutter camera. There is no one single solution to this, it is more a matter of avoiding combinations of Tm and Texp that do not meet the condition (discussed in more detail shortly). In the case of seeking a universal format, the inventors have discovered that sufficient solutions can be assured to be available as long as Texp<=33 ms or (1/30)s (approximately).

Another issue is inter-symbol interference (ISI), which is a result of the filtering effect of the exposure of each line (effectively a box filter applied in the time domain as each line is exposed). To mitigate this, in embodiments the message format is arranged such that each instance of the message comprises a plurality of individual packets 29 (e.g. at least three) and includes an inter-packet idle period (IPIP) 32 between each packet. In embodiments, the inter-packet idle period follows each packet, with the inter-message idle period (IMIP) 34 tagged on the end after the last packet (there could even be only one packet, with the IPIP 32 and potentially IMIP 34 following).

Inter-symbol interference is then a function of packet length and inter-packet idle period. The more data symbols there are in a row, the more inter-symbol interference (ISI). Therefore it is desirable to keep the packet length small with good sized gaps in between. The idle gaps (no data, e.g. all zeros) between bursts of data helps to mitigate the inter-symbol interference, as does keeping the packet length short. Again these properties may be adapted in response to actual knowledge of a particular camera's exposure time Texp being fed back via a suitable back channel such as an RF channel between receiver 4 and transmitter 2 ("negotiated format"), or alternatively the timing may be formatted in a predetermined fashion to anticipate a range of possible exposure time values Texp of cameras the format is designed to accommodate ("universal format"). In embodiments, the inventors have discovered that a packet length no longer than 9 bits separated by an inter-packet idle period of at least Texp provides good performance in terms of mitigating ISI. By convenient coincidence, 9 bits also advantageously allows for one byte of data plus a synchronization bit. Nonetheless, in other embodiments a packet length of up to 12 bits, or even up to 17 bits may be tolerated.

As well as achieving "rolling", another potential issue is synchronization. The receiver has a template of the message format which is uses to synchronize with the received signal—e.g. it knows that after a gap of the IPIP+IMIP, to expect a synchronization bit, then a byte of data, then the IPIP, then another synchronization bit and byte of data, etc. By comparing this template with the received coded light signal, the receiver can synchronize with the signal. In embodiments, in order to assisted synchronization, the inventors have found that the inter-message idle period should preferably be at least 4 symbols of the relevant modulation code, e.g. 4 ternary Manchester symbols.

Given the above considerations, an exemplary message format comprises:
(i) use of a signal format where a message is cyclically repeated (many times) by the transmitter, thus allowing a (temporal) recombination of footprints from consecutive video frames, each footprint containing a partial received message, for obtaining a complete received message—message size may be chosen such that by cyclic repetition eventually the entire message can be recovered;
(ii) a message having relatively short packets (e.g. of 9 bits), separated by inter-packet idle periods for allowing an equalizer to reconstruct the original transmitted waveform in the presence of heavy ISI caused by an un-controllable camera exposure time setting; and
(iii) using a form of Ternary Manchester (TM) as a DC-free modulation code, leading to extra suppression of low frequency components, thus eliminating flicker at low symbol frequencies.

Variations are also possible. For example, while the preferred modulation code is ternary Manchester (which may be abbreviated by the initials TM), other codes could alternatively be used (preferably DC-free or low DC content, with no visible flicker), e.g. conventional Manchester or non-return to zero (NRZ). The following also further describes various particularly advantageous choices for the format parameters (e.g. IMIP). In further embodiments, the IPIP may be tuned to the maximum exposure time. The TM-symbol length may also be tuned to exposure time when exposure time>IPIP. In yet further embodiments, guided descrambling may be used for medium length messages, and/or unscrambled short packets for short messages.

Returning to FIG. 2, some further details are now discussed. As mentioned, existing literature assumes that the source to be decoded covers almost or entirely every frame. It is assumed that the duration of a single message to be decoded is such that in can be captured in the footprint of the source in a single frame. It is recognized that the "hidden lines" 26 can form a problem because of the asynchronicity between the data packets and the shooting of the frames. It is suggested that a message may be repeated such that at least one repetition satisfies the condition of being captured completely within a single frame. However, existing data formats for coded light can still suffer from a number of problems.

As already discussed, a particular problem in using a rolling shutter camera for coded light detection arises because the light source serving as a coded light transmitter may cover only a fraction of the lines of each frame (see again FIG. 2). Actually, only the lines covering the source contain pixels that record the intensity variations of the coded light source. All the remaining lines and pixels do not contain coded light information related to the source of interest. If the source is small, one only obtains short, temporally-interrupted views of the coded light source in each frame and therefore the existing techniques only allow for very short messages.

Another issue is that current smartphones such as iPhones and iPads do not allow for control of the exposure time Texp and ISO by an "app". Existing automatic built-in control algorithms often lead to long exposure times that, after camera detection, lead to heavy inter-symbol interference (ISI) between the digital symbols that are sequentially transmitted by the light source.

Further, current LED driver technology only allows for cheap, energy-efficient solutions if the bandwidth (symbol rate) of the transmitted digital signal is very limited (say a symbol rate between 1 and 8 kHz). For such low frequencies, flicker and stroboscopic effects may become serious, unless special precautions are taken in the signal format for suppressing low frequencies. Having just a DC-free code does not always suffice.

The present disclosure describes a signal format that allows for a reliable combination of the information of multiple video frames such that messages longer than the "footprint", and even messages having a duration of many frames can be captured and decoded. Moreover, the signal format allows for asynchronous (Wiener-like) equalization to undo the ISI caused by the camera at the receiver. Finally, the frequency content of the messages can be such that there are no visible flicker or stroboscopic effects, even for message lengths having a repetition frequency of, e.g., 18 Hz (very sensitive flicker frequency).

Figure 9:
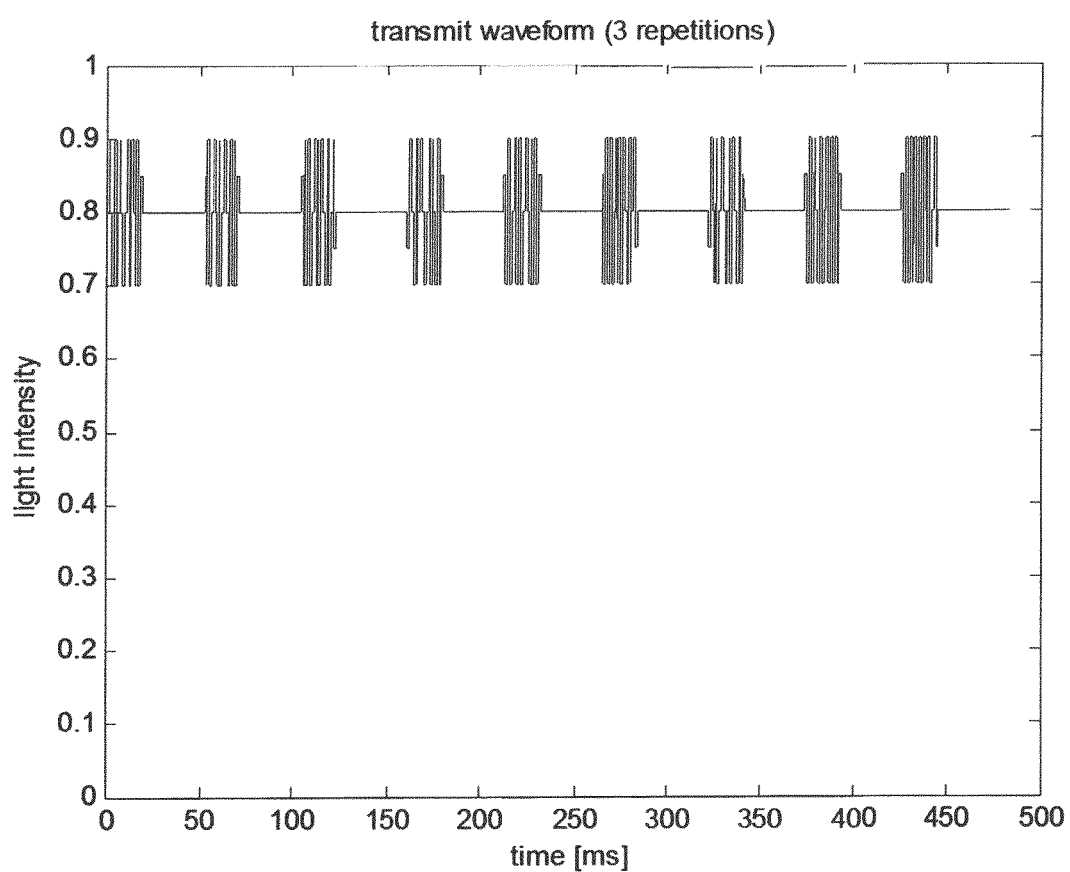
FIG. 9 shows three repetitions of a cyclically repeated message.

A snapshot of a typical coded-light signal at the transmitter is depicted in FIG. 9, which is described next. It is assumed that the light source can vary its (instantaneously) emitted light intensity between 0 and 1. In FIG. 9, the average light intensity (DC) is set to 0.8, and the amplitude of the coded light signal equals 0.1. The coded light signal is superimposed onto the average (DC) light level.

A message, in this example having a duration of 161 ms, consists of 3 packets, each packet comprising 9 TM-encoded bits. A message is cyclically repeated by the transmitter (3 repetitions are shown in FIG. 9). The TM-symbol rate equals 1 kHz (1000 TM-symbols per second).

Each packet of a message in this example is trailed by an inter-packet idle period of 33 TM-symbols (~33 ms). At the end of each message, there is an (extra) inter-message idle period of 5 TM-symbols, resulting in a total idle period of 33+5=38 idle symbols between the third packet of the current message and the first packet of the next message. FIG. 9 depicts 3 repetitions of a message, where each message consists of 3 packets.

Figure 10:
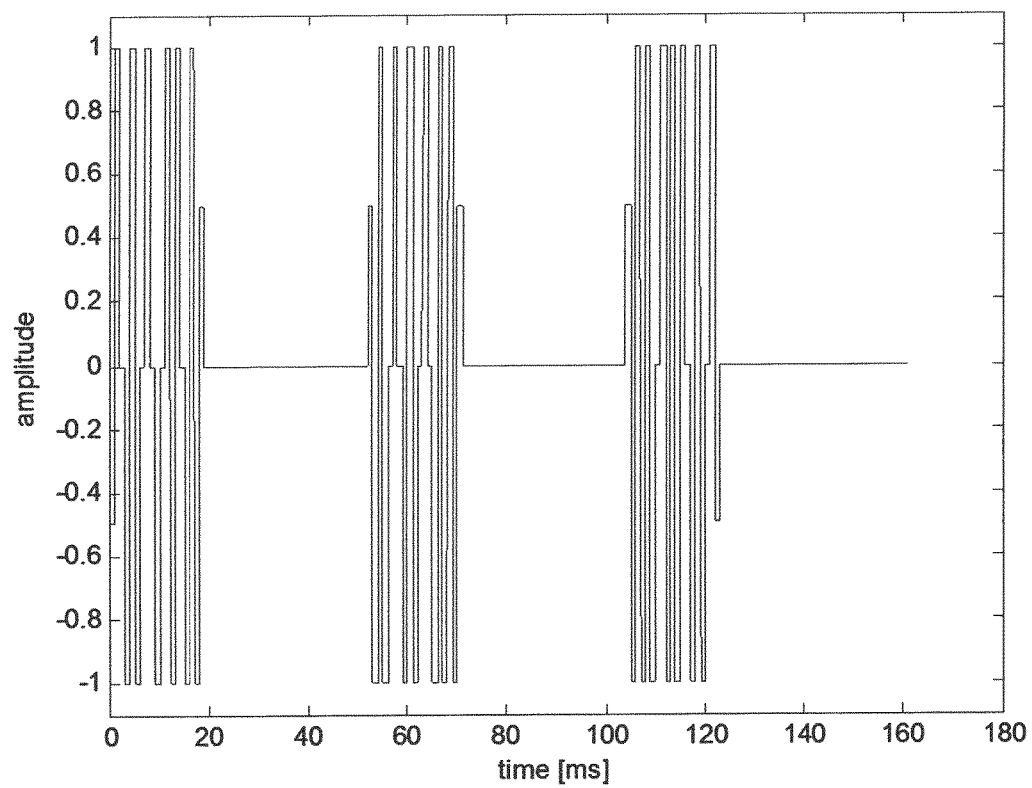
FIG. 10 shows a message consisting of three packets.

FIG. 10 depicts a single message of FIG. 9, where the DC has been removed and the amplitude of the signal has been made equal to 1. The active part of each packet consists of 9 TM-encoded bits, leading to 2·9+1=19 TM symbols. Note that the first and the last TM symbol of each packet have an amplitude of ±0.5, consistent with TM encoding rules. The message format, as described in FIGS. 9 and 10, can be decoded using a camera that has any given Texp such that Texp≤1/30. In general all parameters such as e.g., TM-symbol rate, idle periods, modulation code may be selected to facilitate detection.

The reason for cyclically repeating a message is that, at each frame of a rolling shutter camera movie, only a small part of the transmitted message may be recoverable. The size of that part depends on the size of the light source in the images of the camera (footprint), and of the duration of the message. For instance, if the size of the light source is such that only 14% of the lines of a frame are covered by the light source, and if the duration of the message is in the order of 5 frames (assuming a recording speed of 30 frames/second), only about 3% of a message is potentially recoverable from a single movie frame.

If the message duration is carefully chosen with respect to the frame rate of the movie, consecutive frames of the movie reveal different parts of the repeated message such that eventually the whole message is recovered.

Figure 8:
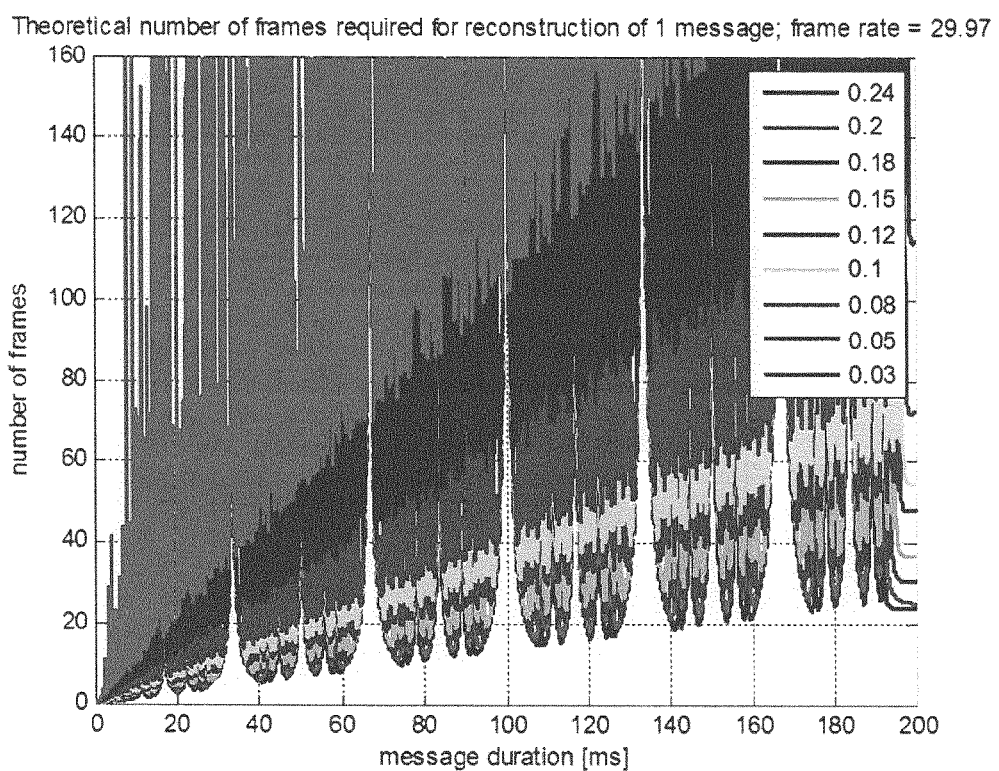
FIG. 8 is a graph of a number of frames required for message reassembly.

FIG. 8 depicts how the number of frames required for obtaining a complete message, depends on the message duration and the size of the footprint in the image for a frame rate of 29.97 fps.

The following considers the relationship shown in FIG. 8. For each frame of duration Tf, a view of duration Tfootprint of the message is obtained. A collection of N footprints of N consecutive frames has to cover at least 1 complete message. The footprints have to "roll" over the messages. Footprints have a repetition frequency equal to the frame rate (=29.97 Hz), messages have a repetition frequency of 1/Tm, and these frequencies must be "sufficiently" different.

It may also be desired to minimize N, as a large N leads to large latencies. Also for a "small" footprint, one may desire a small N, e.g. N=30~1 second.

Transmitter frequency deviations lead to Tm variations. Some deviations may lead to "slow rolling" or even absence of rolling. N has to remain reasonable for a certain range of message durations around a nominal value.

Now consider what happens to covering a message with footprints if:

relative footprint α=Tfootprint/Tf=0.4

0<α≤1, (in practice e.g. 0<α≤0.88 due to hidden lines) If Tm is about Tf, the message barely rolls (each frame sees practically the same part of the message). But if Tm is about 1.5 times Tf, the message "switches" so that every other frame sees alternate parts of the message, but some parts are repeatedly missed.

It turns out that, if α<1, one obtains "non-rolling" footprints if the message durations Tm are a multiple of the frame duration Tf. If α<0.5, one obtains "switching" footprints if Tm is a half-integer multiple of Tf (0.5, 1.5, 2.5, . . . ).

In general, if $1/(n+1)<\alpha \leq 1/n$, where n is integer, then one encounters "non-rolling" footprints if:

$$\frac{T_m}{T_f} \in \left\{ \frac{k}{m} \,\middle|\, m=1, \ldots, n, \quad k \in N^+ \right\}$$

It turns out that the rolling may already be insufficient if the above ratio is "close" to one of the "non-rolling" ratios. It also turns out that the rolling may already be insufficient if the above ratio is "close" to one of the "non-rolling" ratios.

The result is a complicated relationship as seen in FIG. 8.

Modulation Code

The preferred modulation code for low bit rates is ternary Manchester (TM) because of the extra suppression of low frequency components that may lead to flicker. Low bit rates might be imperative because of two reasons: (i) the limited affordable complexity and minimum required efficiency for drivers of the LED light sources; and/or (ii) for obtaining a signaling speed that can be recovered for very long exposure times.

Comparing NRZ, Manchester and ternary Manchester, note that NRZ (actually: no modulation code) has a very high DC content. The Manchester modulation code, well-known from magnetic recording, and also proposed for the IEEE Visible Light Communication (VLC) standard, is a so-called DC-free code, i.e., the spectral content at frequency zero equals 0. The Ternary Manchester modulation code is a so-called $DC^2$-free modulation code, implying that the spectral density around DC remains much smaller compared to a DC-free code like Manchester. In the spectra for low frequencies, Tm is therefore advantageous compared to Manchester. For flicker, frequencies up to 100 Hz are important.

Since the signal format makes use of relatively short packets, interspersed with idle symbols, one can guarantee a message to be $DC^2$-free, by letting each packet be $DC^2$-free. This is accomplished by modulating the user bits using the TM impulse response {−0.5, 1, −0.5}. Note that a packet of 9 user bits leads to a TM-encoded packet of 19 TM-symbols.

For larger bit rates, other modulation codes, maybe even multi-level DC-free modulation codes (e.g. quaternary Manchester) also can be envisioned, provided the spectral densities do not lead to visible flicker.

The modulation codes to be used can be defined in a manner that allows for some freedom in the actual implementation of the driver, e.g. for drivers having an Amplitude Modulation (AM) implementation or for drivers having a Pulse Width Modulation (PWM) implementation. This implies that, in contrast to traditional modulation formats, the actual shape of the waveforms to be transmitted is not exactly defined for coded light.

A preferred way of defining a modulation code for coded light would be to define the rules and acceptable values of the output of a full-T moving-average filter applied to a modulator output waveform at the optimum sampling points.

Packet Length

Turning to the question of packet length, the packet length is preferably chosen such that the worst case data pattern is still recoverable under worst case exposure times.

Figure 11:
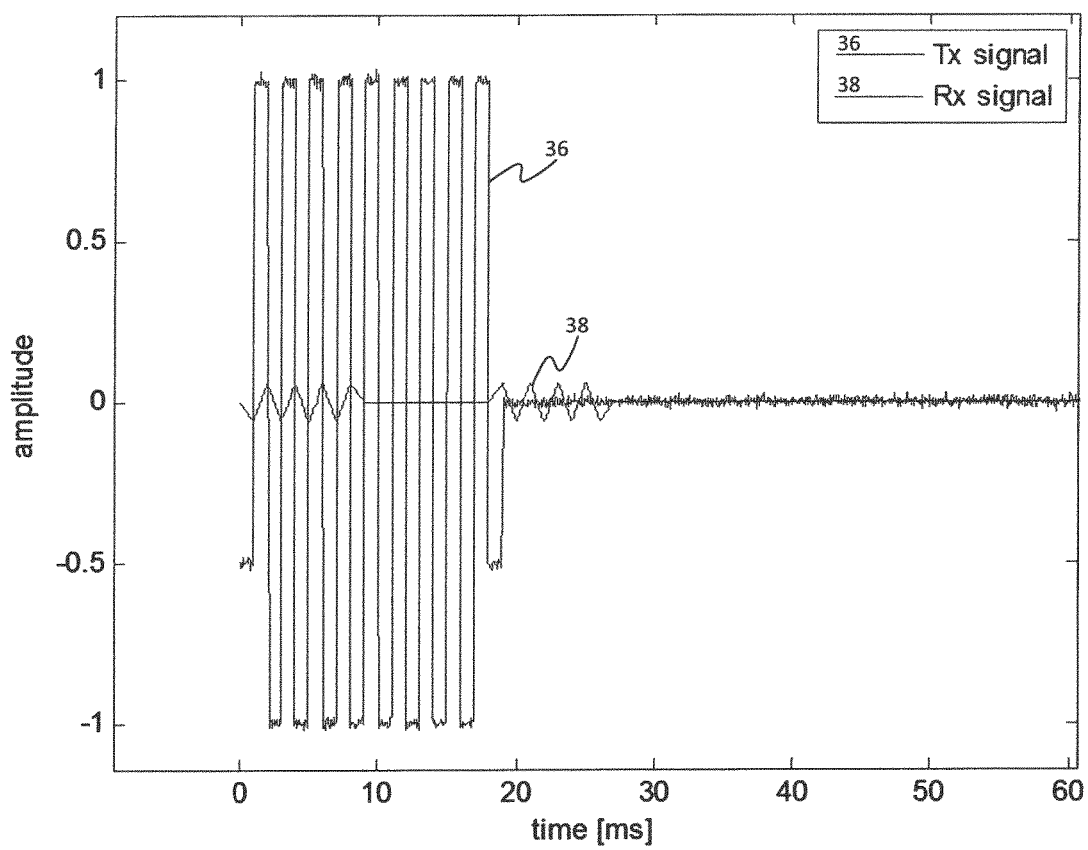
FIG. 11 shows transmitted and received signals in the time domain.

An example is shown in FIG. 11. Consider a transmitted waveform 36 corresponding to a TM-encoded packet of 9 bits consisting of all ones (fsymbol=1 kHz). If this waveform is detected by a camera having a Texp=$\frac{1}{125}$ [s], one can obtain a 1-dimensional received waveform 38 at the output of the camera, by proper processing of a sequence of video frames. Note that the received signal, which is a distorted version of the transmitted signal, can be seen as would be generated by the camera, by convolving the transmitted signal by a rectangular box function, corresponding to a FIR filter action of Texp (moving average over Texp seconds).

The moving average filtering of Texp leads to inter symbol interference (ISI) between the TM-symbols of the packet. Note the reduction of the amplitude of the received signal with respect to the incoming transmitted signal. Also note that in the last half of the packet the amplitude of the received signal has been reduced to zero. Finally note that the received signal extends beyond the transmitted signal by Texp=8 ms because of the causal FIR-type filtering by Texp. It is the task of the signal processing in the receiver to reconstruct the transmitted signal from the received signal.

Figure 12:
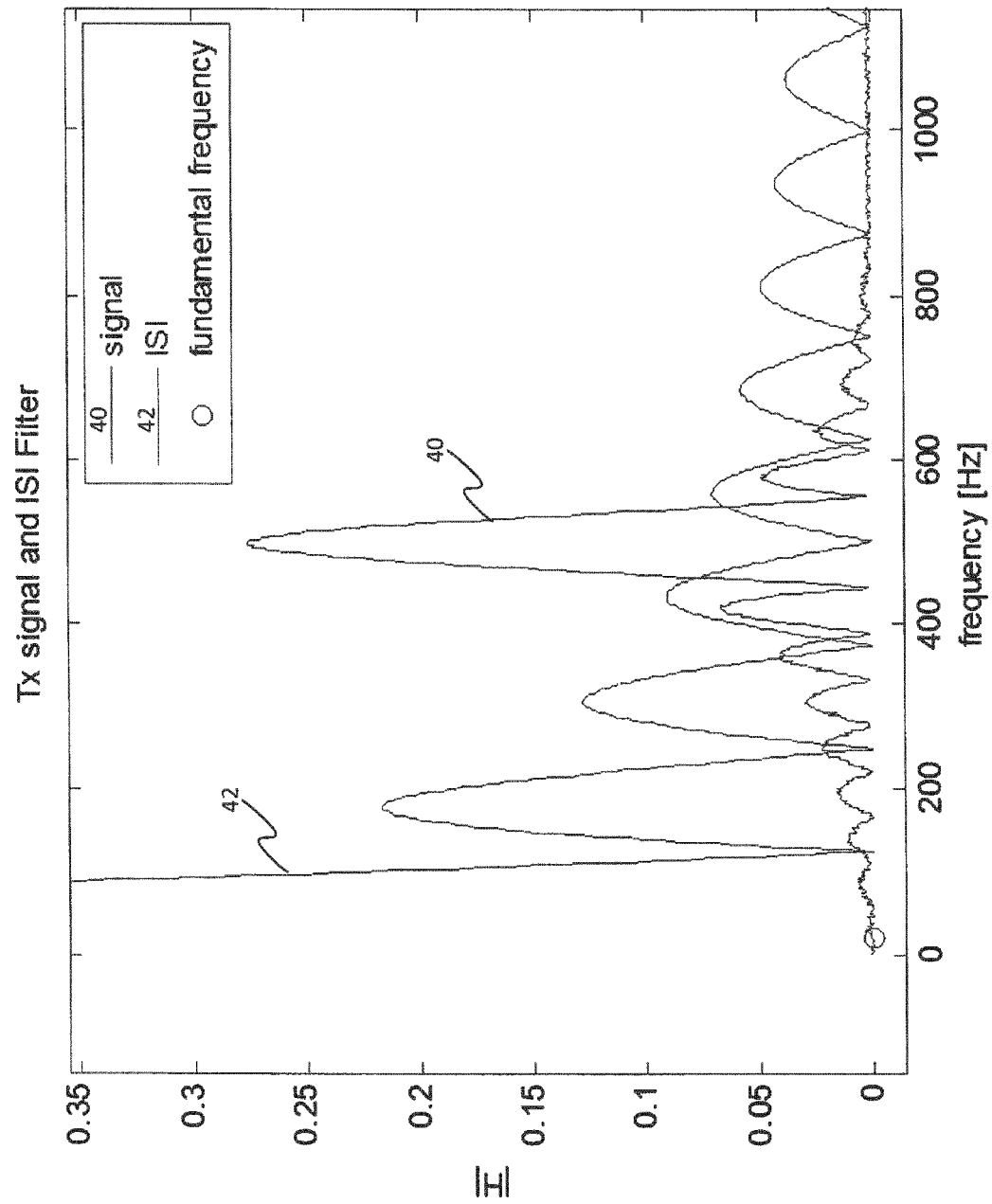
FIG. 12 shows a transmitted signal and ISI in the frequency domain.

FIG. 12 shows the same situation in the frequency domain. The curve 40 represents the absolute value of the spectral representation (the Fourier transform) of a single 9-bit TM-encoded packet consisting off all ones. The curve 42 represents the absolute value of the transfer function of the "Texp moving average filter". The received signal in the frequency domain is the dot product of both spectral representations. Note that the zeros of the ISI filter are particularly detrimental to the received signal, since the signal at those frequencies (and at the frequencies in the neighborhood of the zeros) effectively are removed from the transmitted signal.

If one desires that the transmitted signal is recoverable from the received signal, it is required that at least sufficient signal energy remains after filtering the transmitted signal with the ISI filter for all reasonable choices of Texp. For this to happen, the spectral representation of the transmitted signal has to be sufficiently "spread" across many frequencies (for all possible choices of the bit content of a packet). This turns out to be the case if the packet length is in the order of 9 bit.

On the other hand, if one would make a packet (consisting of all ones) longer than 9 bits (say 17 bits), the spectral representation of such a long packet would still be concentrated around 500 Hz, but its spectral width would be about ½ of the original packet. It turns out that in that case too much signal energy is destroyed by the ISI filter.

The inventors have found that, using TM modulation with fsymbol=1 kHz, for a packet length from say 9 to 12 bits, one can recover the transmitted signal sufficiently accurately for all Texp≤($\frac{1}{30}$)s, provided the inter-packet idle period (IPIP) is at least Texp. Note that, if IPIP=($\frac{1}{30}$)s, a fixed transmit signal format works for all Texp≤($\frac{1}{30}$)s. This may be used to provide a universal signal format.

If the packet length is between 12 and 17 bits long, it turns out that the minimum eye height of the eye pattern is determined by only a few "detrimental" bit patterns that have a poor spectral representation that can be destroyed by the "Texp moving average filter" in such a manner that it is irrecoverable. If those detrimental bit patterns are only a few, one can avoid those from occurring by so-called "guided scrambling". However, it turns out that one requires in the order of 16 different scrambling patterns for applying a useful guided scrambling. Since the index of the scrambling pattern also has to be encoded in each packet, the number of useful bits would again be reduced to 8 or 9 per packet. So for very short repeated messages, the un-scrambled short packets may be deemed to be most useful. For longer messages, guided scrambling may be very useful.

Messages Constructed from Multiple Packets

For transmitting a useful amount of information from a light source to a camera receiver, messages are constructed which consist of a concatenation of p packets, where each packet has its own bit content. Between each two packets, there is at least an inter-packet idle period (IPIP) to prevent ISI crosstalk between different packets. At the end of a message, there is an extra inter-message idle period (IMIP). A message consisting of p packets is cyclically repeated.

In a preferred embodiment, p=3, so effectively 3 bytes of information (24 bits) are transmitted per message.

Inter-Packet Idle Period

The purpose of the inter-packet idle period (IPIP) is to limit the ISI induced by the exposure time (Texp) of the camera to a single packet. In a preferred embodiment, the duration of the IPIP shall be equal to the maximum expected exposure time, Texp_max. This may provide a universal IPIP format, since it allows recovery of the messages for any Texp if: Texp≤IPIP=Texp_max.

The inventors have also found that messages are recoverable if Texp>IPIP, for carefully chosen TM-symbol rates, where the carefully chosen TM-symbol rates then depend on the actual Texp used by the camera. Formats exploiting the enhanced signaling speed for this case will belong to the "negotiated signal formats", since the transmitting light source and the camera receiver should agree on the choice of transmit parameters such as TM-symbol rate, number of packets per message, IPIP and/or IMIP, to ensure that the actual coded light transmissions can be received. The choice of these parameters depends on the available camera settings of, e.g., Texp, frame rate, line rate and the footprint of the light source.

Note, while embodiments herein are described in terms of an IPIP following each packet and an extra IMIP being tagged on the end of the last IPIP, in an alternative description or implementation an IPIP may be included only between adjacent packets of the same message, with the total idle period following the end of the last message being the IMIP.

Inter-Message Idle Period

The inter-message idle period (IMIP) is an idle period that is appended after the last IPIP which trails the last packet of a message. The IMIP may be measured in TM symbols.

The IMIP Serves Two Goals:

(i) to make sure that the total message duration is such that it satisfies nice "rolling properties" given the frame rate, i.e. such that footprints of consecutive frames reveal the complete message as fast as possible; and/or (ii) the second purpose of the IMIP is to provide an asymmetry in the pattern of packets and idle periods within the cyclic repetition of messages. This property can be used in the cyclic synchronization of a receiver.

Synchronization Elements of Format

For synchronization purposes, two elements of the signal format are significant.

(i) The usage of the first bit of each 9-bit packet as a synchronization bit. In a preferred embodiment, the first bit of the first packet of a message shall be one, while the first bit of all remaining packets shall be zero.

(ii) The usage of the inter-message idle period (IMIP). The presence of a non-zero IMIP breaks the regular temporal packet structure in a repeated message, because the total idle time after the last packet of a message is longer than the idle times between the other packets.

In a preferred embodiment, the IMIP shall have a duration of at least 4 symbols.

EXAMPLE PARAMETERS

Given all of the above considerations, some example parameter choices are:
fsymbol≥1 kHz (flicker and strobo),
envisioned packet durations:
around 52 ms (≥49 ms) for fsymbol~1 kHz
around 26 ms (≥24.5 ms) for fsymbol~2 kHz
around 13 ms (≥12.25 ms) for fsymbol~4 kHz,
message durations Tm are an integer multiple of packet durations, and/or
interesting message durations: around 26, 52, 104 ms.
For Instance:
the exposure time is less than or equal to (1/30)s, the symbol rate is 1 kHz and the packet is 52 ms including inter-packet idle period;
the exposure time is less than or equal to (1/60)s, the symbol rate is 2 kHz and the packet is 26 ms including inter-packet idle period; or
the exposure time is less than or equal to (1/120)s, the symbol rate is 4 kHz and the packet is 13 ms including any inter-packet idle period.
Other example parameter choices:
3-packets format (with CRC) having a duration of 158 ms @ 1 kHz symbol rate, with the 158 ms corresponding to a 3-byte message having an IPIP of 33 symbols and an IMIP of 2 symbols; or
a packet length of 70 symbols ~35 ms @ 2 kHz, with the 35 ms corresponding to a 3-byte message having an IPIP of 3 symbols and an IMIP of 4 symbols (e.g. this format can be used where T_exp is controlled to be less than (1/500)s).

In a negotiated format case, the controller may be arranged to select between a list of multiple combinations of parameters, comprising any of one or more these combinations, and/or other combinations. In a universal format, one particular combination is pre-chosen to satisfy as many cameras (or rather exposure times) as possible.

Cyclic Redundancy Check (CRC)

In a preferred embodiment, a message consists of several packets, where each packet contains 1 byte of information. In case a CRC is used, it is suggested that the last byte of each message is an 8-bit CRC. Because of the repeated decoding results delivered by a receiver decoding the cyclically repeated signal format, one can obtain potentially many realizations of the transmitted message, which allow the reliability of a received message to be enhanced by comparing the decoding results of consecutive decoded variants of the same message.

In a preferred embodiment, the CRC is characterized by a pre-load and parity inversion. The pre-load can be application-specific, thus allowing a receiver to distinguish between messages from different applications in use in the same environment. Note that there is a trade-off between the number of different pre-loads in use, and the effective error-detection capability of the CRC Multiple Messages The inventors have found that one can transmit a concatenation of different messages $m_i$, where each message $m_i$ is repeated N times, where N is a sufficient number of times such that a camera receiver can reconstruct reliably a complete message $m_i$ given the footprint of the transmitting light source. After N repetitions of the same message $m_i$, the light source can transmit a completely different message $m_{i+1}$ having the same signal parameters, by just concatenating, say N, repetitions of message $m_{i+1}$ right after $m_i$. It turns out that a receiver is capable of recognizing a coherently reconstructed message by observing the CRC.

Message Reassembly

The following describes a process of reassembling or "stitching" of video frames for coded light message recovery by a camera. The receiver receives a signal formatted as described above and re-assembles the parts of the message into a complete message, which is then provided for further processing.

In embodiments the reassembly process comprises the following.

(i) For each of multiple frames, establish a sample per image line as described above (see again the samples 19 taken from lines 18 in FIG. 2).

(ii) Collect all the (active) samples of a given frame into a time-sequence (each positioned at the respective time at which the sample from that line was located within the frame). This sequence forms a "marginal signal" or "frame signal" for each frame.

(iii) Next extend the signals with zeros resulting in an "extended marginal signal" or "extended frame signal", where the duration of each extended signal is n times the message duration (n being an integer) and where the duration is longer than the frame duration.

(iv) Next the active samples are time-aligned, i.e. shift the samples per line by Tframe to the right within the time frame or scale defined by the extended signal. This is done cyclically, i.e. in a wrap-around fashion wrapping around beyond the end of the extended frame signal length. This way the shifted position of the samples within the extended framework is such that it facilitates reassembly.

(v) Next the samples are collapsed (i.e. reassembled). In embodiments different reconstructions can be found by shifting one measurement further.

Once reconstructed the signal can be filtered to eliminate inter-symbol interference (ISI), e.g. using a Wiener filter.

In embodiments, the ISI filter is robust enough to handle gaps in the reassembled data (this robustness being at least in part a result of the modulation code, message format and the Wiener filter). The process may also allow elegant handling of skipped frames.

In further embodiments, as an additional feature, the process may also allow the receiver to correct for clock deviations relative to the timing of Tm or Tframe based on correlation of reconstructed signals.

An example of the message reassembly process will be discussed in more detail shortly, but first some example details of the receiver front end are elaborated upon with reference to FIGS. 1 to 4.

In embodiments, the camera-based, digitally-coded light receiver disclosed herein is very different from the class of well-known receivers of digital signals using radio or IR communication. Both the general structure of the coded light receiver, as well as the detailed algorithms for performing the sub-tasks within a coded light receiver, are quite distinct.

The input of a camera-based coded light receiver consists of a movie taken in a known format. For instance, a well-known video format is 480p, a progressive scan format having frames taken at 29.97 frames per second (fps), where each frame consists of 480 lines and each line contains 640 pixels. The coded light receiver consists of the digital signal processing applied to this movie for obtaining the digital content of the modulated light source.

The signal processing performed by the receiver may comprise 2D signal processing and 1D signal processing. The 2D signal processing may comprise:
(i) selection of an appropriate color (R, G or B) or a linear combination of colors for extracting the coded light signal;
(ii) image segmentation using a blob approach, efficiently identifying regions in the image containing coded light sources;
(iii) identifying spatial filter "active pixels" within each blob;
(iv) efficient motion compensation (independently for each source) using marginal; and/or
(iv) computing signal "marginal" by combining of active pixels per line (computing samples 19 resulting from each line 18 in FIG. 2).

The 1D signal processing may comprise:
(i) using correlations within a frame for estimating the transmit clock (works best for footprint>>duration of message);
(ii) assuming the use of the above-described signal format, where a message is cyclically repeated by the transmitter, and exploiting the knowledge of the repetition time of the message (Tm) and the knowledge of the number of frames per second (Tframe) for reconstructing a complete message from the partial snapshots obtained in each frame (this is the reassembly process to be described in more detail shortly);
(iii) using correlations between successive reconstructed signals for estimating the transmit clock;
(iv) using robust Wiener filtering on a single period of the message for mitigating the ISI caused by Texp;
(v) applying robust Wiener interpolation if the reassembly procedure has left holes in the reconstruction;
(vi) finding global circular synchronization by processing using a sync template;
(vii) decoding the bits by making decisions on the optimum sampling points given by the global circular synchronization; and/or
(viii) checking CRC on consecutive reconstructed messages. If m out of n consecutive reconstructions have CRC=OK, accept the message.

For a particular message format and a given footprint, it may take for example 30 consecutive frames for reassembling a complete message. If one has a recording of 2 seconds (say, 60 frames), the receiver can generate 31 different realizations of the same message. In embodiments, by comparing theses different decoding results it is possible to aid synchronization of the receiver clock with the received signal.

Regarding the selection of appropriate color, it turns out that the section of the appropriate color can be significant for recovering the coded light signal. For instance, the color Green (G) is characterized by the highest pixel density in the camera, thus giving the highest spatial (and thus temporal) resolution of a coded light signal. This may be of importance if the coded light is using a high symbol frequency (wide bandwidth). On the other hand, it turns out that the color blue (B) is favorable if a light source has a high intensity and if Texp is rather long, since this color tends to lead to less clipping of the pixels.

Figure 4:
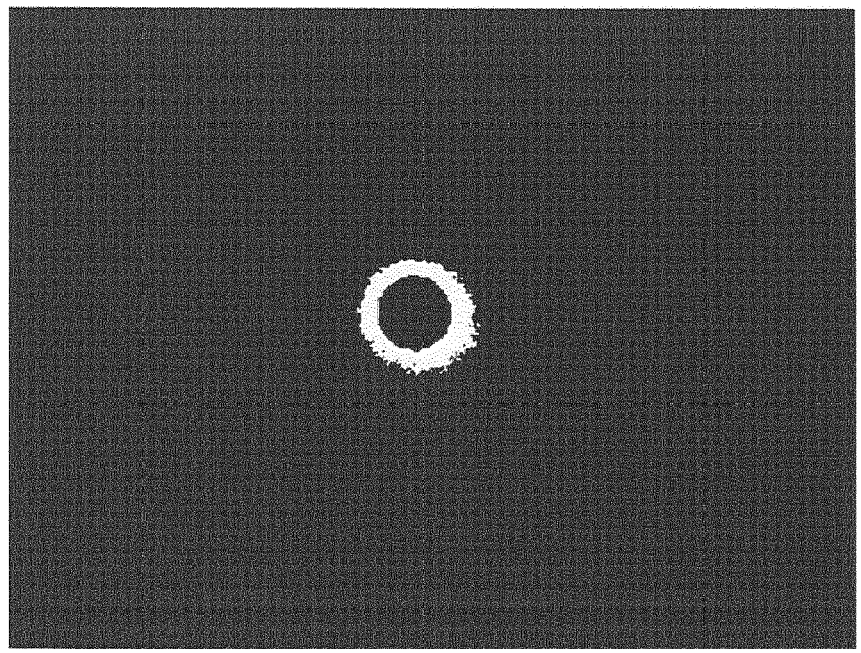
FIG. 4 shows an example of usable samples obtained from a captured frame, FIG. 5 schematically illustrates a Ternary Manchester coding scheme, FIG. 6 schematically illustrates an example signal coded using Ternary Manchester, FIG. 7 schematically illustrates a message format.
Figure 5:
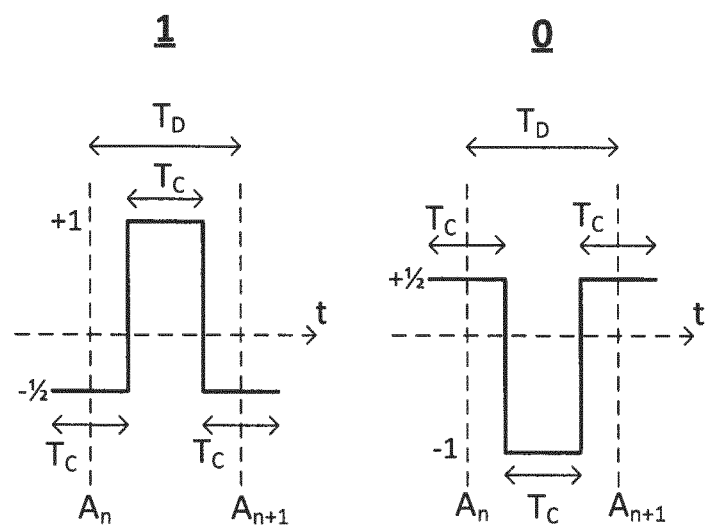
Figure 6:
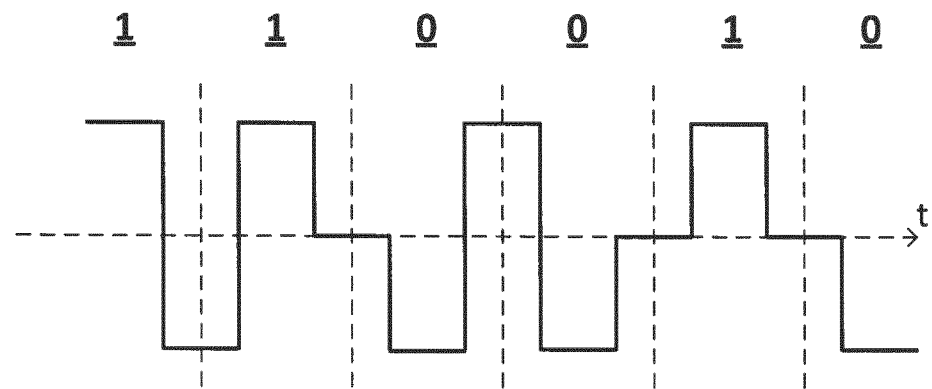

Referring to FIGS. 2 to 4, for image segmentation, embodiments of the present disclosure use a "blob"-approach for recognizing regions in an image that can be associated with a lamp possibly transmitting coded light information. Typically, a blob is a region of high intensity in an image (e.g. see FIG. 3). An algorithm can recognize and differentiate different blobs in an image. For example using edges of the blobs allows for efficiently tracking a blob and limiting the 2D signal processing associated with each blob in the different frames of the video sequence.

To find contributing pixels within a blob, only those pixels that are modulated, i.e., have sufficient intensity variations due to the modulated light source, contribute effectively to the signal. Other source pixels effectively only produce "noise" or other unwanted side effects. Typically, pixels that are clipped are also removed from further consideration (e.g. see FIG. 4). Also pixels having insufficient intensity are removed. The resulting set of "contributing pixels" belonging to a light source can be represented as a binary spatial 2D filter The following describes of an algorithm that operates on the samples that are obtained as the "marginals" in each frame (the samples 19 in FIG. 2, i.e. the "line-combined" samples).

FIG. 3 depicts a receiver-generated binary picture that indicates the source of interest. FIG. 4 shows, in binary, the contributing pixels of the selected source in each frame. Note that the pixels in the center part of the source do not contribute, because those pixels are over-exposed, i.e. clipped.

Figure 13:
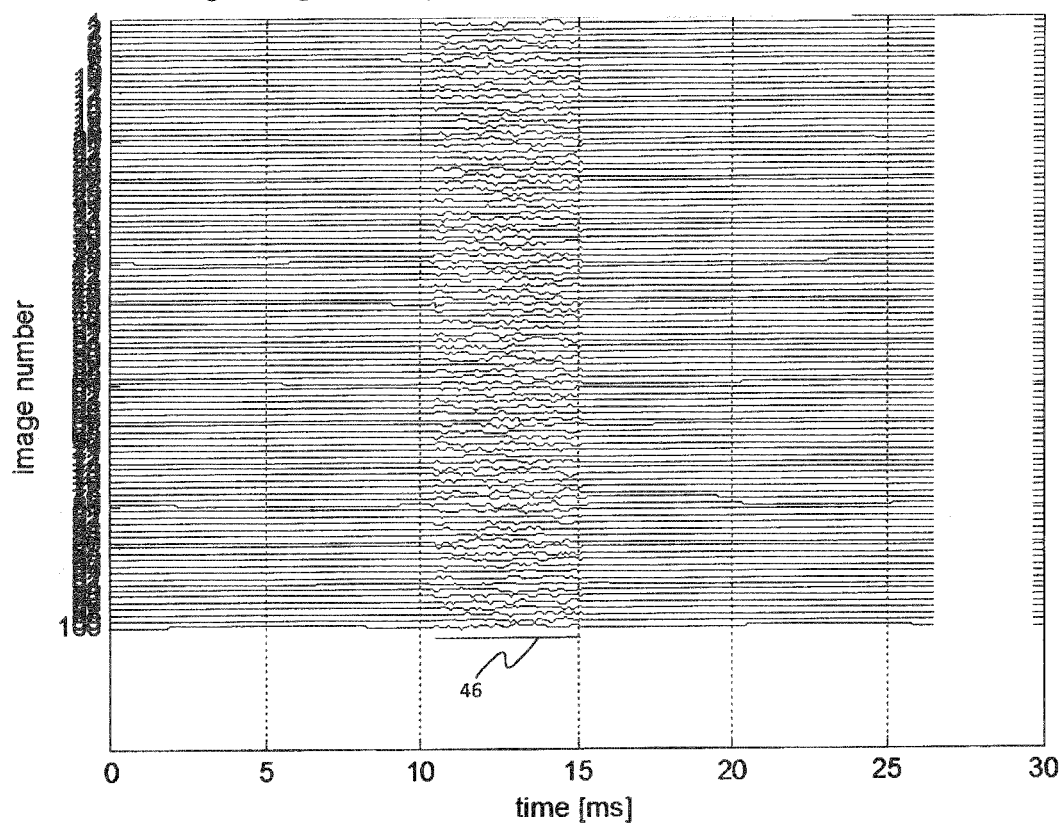
FIG. 13 shows signals obtained by sampling each of a plurality of frames.

FIG. 13 shows the "marginal signals" (made up of the samples 19 from FIG. 2) of each of the 100 consecutive frames shot in the movie, each sample obtained by a proper operation of the active pixels of its corresponding line. I.e. each "marginal signal" is the signal obtained from one given frame 16, with the samples 19 taken from each active line 18 of that frame being positioned in time at the respective times within the frame duration at which they were sampled. Note that in FIG. 2 the time axis corresponding to consecutive samples of a single frame runs from top to bottom, while in FIG. 13, the time axis of consecutive samples in a single frame runs from left to right (with the page in landscape). In FIG. 13, the 100 consecutive video frames (each frame generating a single 1-dimensional signal) are stacked on top of each other, consecutive frames going from top to bottom.

Note also that, although Tframe equals about 1/30~33 ms, the marginal signal of a single frame has a duration of only about 26.5 ms due to the hidden lines 26. At the bottom of FIG. 13 is shown a bar 46 that indicates the samples that originate from the lines that cover the light source in each frame, i.e. only this part of each row contains samples that originate from the source. For this example, it turns out that the footprint of the source with respect to a frame, FSF~0.14, i.e. only about 14% of the lines per frame actually contain pixels of the source.

Figure 14:
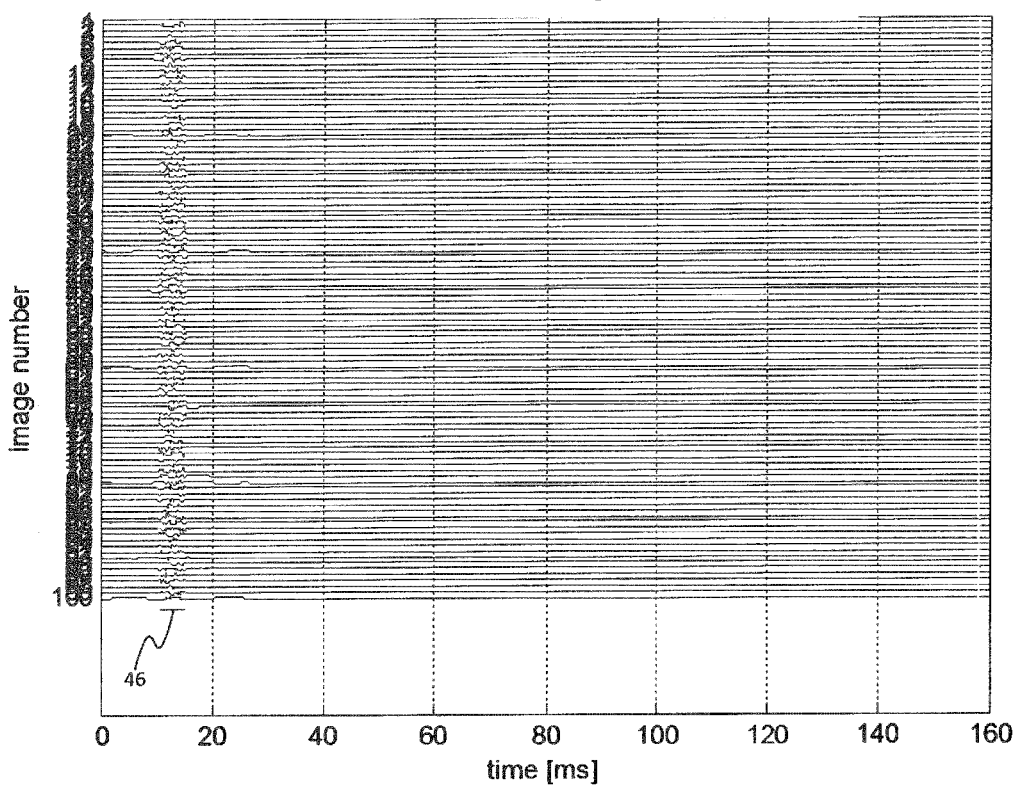
FIG. 14 shows extended versions of the signals obtained from sampling frames.

In FIG. 14 it is shown how to use the known durations Tm and Tframe to generate "extended marginal signals" or "extended frame signals", each being an extended version of the signal sampled from a respective frame. This is done as follows.
(i) Define for each frame a stretch, i.e. a temporal region around (e.g. extending after) the active samples of FIG. 13, such that a stretch duration of m times Tm is obtained, where m is a conveniently chosen integer. Note that zeros can always be added or removed outside the active samples.

(ii) Compute num_periods=ceiling(Tframe/(m*Tm)), where "ceiling" means round up to the nearest integer.

(iii) Cyclically repeat each stretch num_periods times such that an "extended marginal signal" is obtained for each frame having a total duration of at least Tframe. Note that the extended marginal signal always has a duration that is larger than Tframe, and that it is an integer multiple of Tm.

In the example, Tm=158 ms; Tframe=33.36, so m=1 and num_periods=1, and each frame is extended by zeros to obtain a stretch of 158 ms (=1 period of the message). Note that the actual useful observation in each frame (stretch) is only a fraction of about 0.03 of a complete message, indicated by the bar 48 in FIG. 14. One may say that the footprint of the source with respect to a message, FSM, ~0.03.

Note that in embodiments it is not necessary to use two separate integers m and num_periods. The point is to determine a time period that is an integer multiple of the message length (duration) Tm, and which is longer than the frame length (duration) Tframe. This period defines a reference time scale or reference frame within which the signals obtained from the different frames can be aligned, as now disused.

The time-alignment of the observations originating from the different frames is performed using Tframe and the now-defined reference framework or scale determined as explained above. The "extended marginal signal" of each line is shifted Tframe to the right (in the positive time direction) with respect the extended marginal signal of its previous frame. However, as the extended marginal signals were made a multiple of the message duration Tm, and because the transmitted message is repeated cyclically, one can replace the shift of each extended marginal signal by a cyclic (wrap around) shift, thus obtaining the results in FIG. 15.

That is, as mentioned, the "extending" discussed above provides a timing reference period, which defines scale or framework within which to position the signals obtained from each frame. This reference period has a length being an integer multiple of the message duration Tm. Furthermore, the scale or framework it defines wraps around. I.e. beyond the end of the timing reference period, the scale or framework wraps back around to the beginning of the reference period. Hence if in shifting the signal from a given frame right by Tframe relative to its preceding frame causes a portion of that frame's signal to shift "off the end" or "off the right hand side" of the reference scale or frame (beyond the timing reference period, i.e. beyond the integer multiple of Tm that has been defined for this purpose), then the portion of that signal continues by reappearing at the beginning of the reference scale or frame (starting from time zero relative to the timing reference period).

Note that in embodiments, it need not be necessary to "extend" the signals from each frame (the "marginal signals") by adding zeros. This is just one way of implementing the idea of creating a wrap-around reference frame that is an integer multiple of the message duration Tm. An equivalent way to implement or consider this would be that this timing reference period (that is an integer multiple of Tm) defines a "canvas" on which to place the signals from each frame, and on which to shift them by their respective multiples of Tframe in a wrap-around manner.

Note also that in all cyclically-shifted, extended marginal signals, the receiver keeps track of the locations of the active samples originating from the coded light source.

Figure 15:
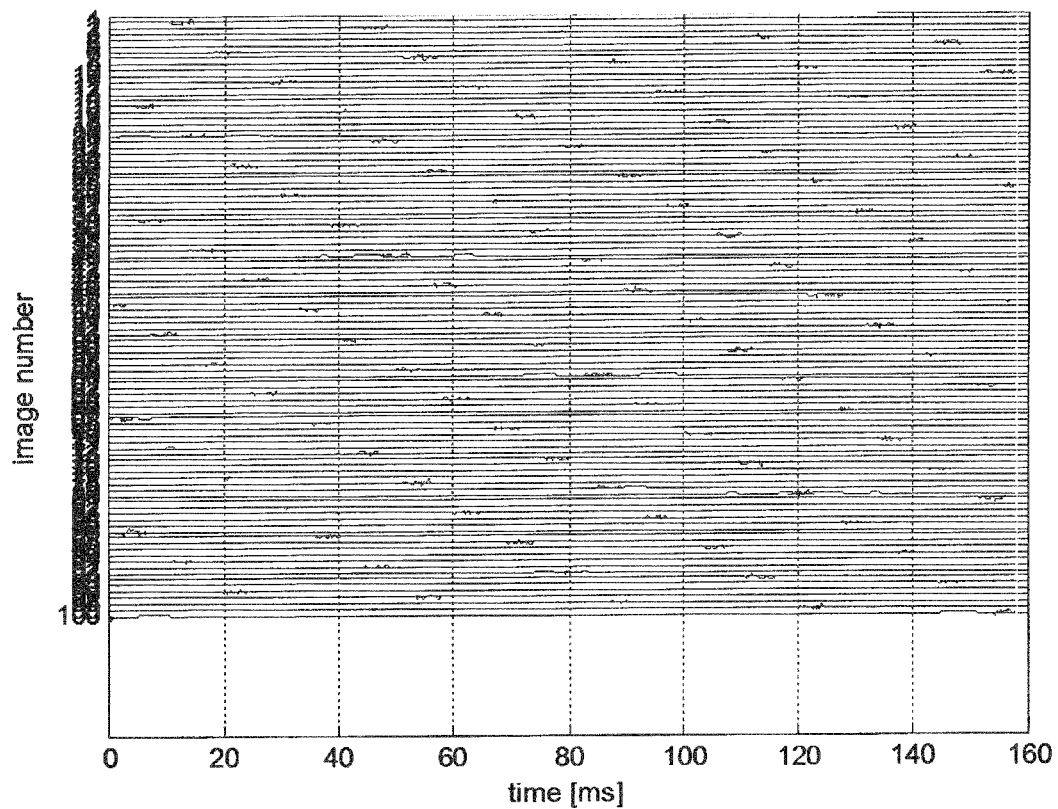
FIG. 15 shows time aligned versions of the signals from a plurality of frames.

Having results as in FIG. 15, the receiver can now, for each time sample of the message, look in the vertical direction for frames that have a valid contributing sample at that position.

From the FSM being about 0.03, one can expect that it takes at least (0.03)−1~33 frames for recovering a complete message. Typically, because of overlap, in embodiments the receiver may need about twice that many frames for complete recovery.

Figure 16:
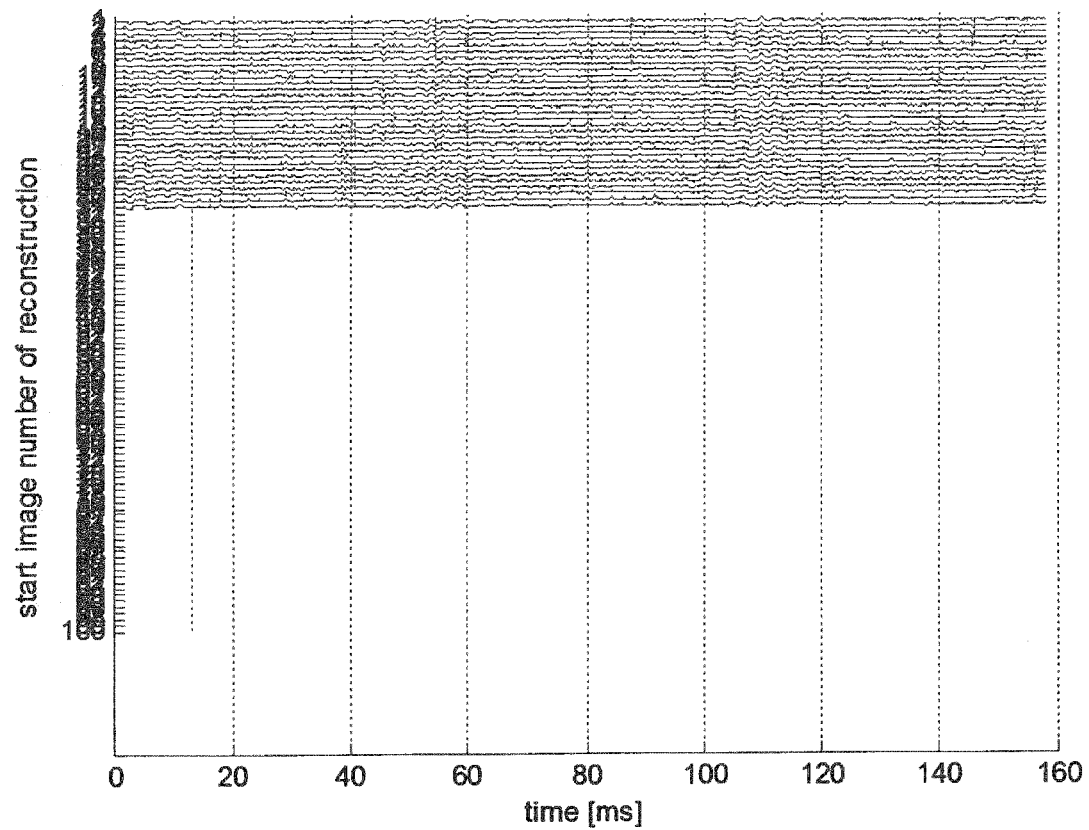
FIG. 16 shows signals reconstructed from a plurality of frames.

From FIG. 16, it can be seen that the decoder, in the example, needs 70 consecutive frames for a reconstruction of a complete message (a movie of ~2 seconds). Since each 70 consecutive frames give a reconstruction, a video of 100 frames gives 31 different reconstructions (albeit they are dependent).

Figure 17:
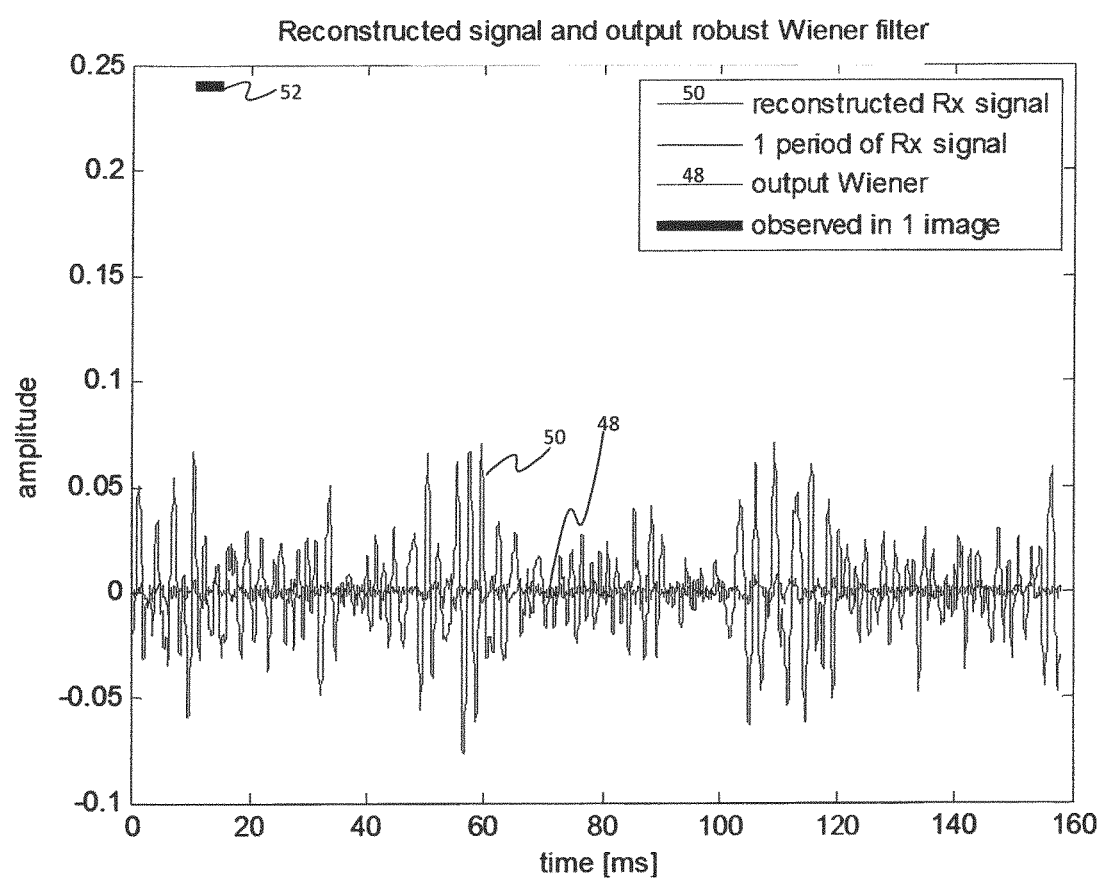
FIG. 17 shows a reconstructed message.

FIG. 17 shows the result of the reconstruction 48 (and output the of the robust Wiener equalization 50) of the first reconstructed message. The length of the bold bar 52 at the top of the figure indicates which fraction (~3%, ~5 ms) of the complete message is obtained from a single frame in this example.

In further embodiments, the procedure described above also can deal with so-called "skipped frames". The assumption is that a possibly skipped frame is detected by observing the frame recording times that are given by the camera. If a frame is skipped, the corresponding marginal signal will obtain no valid support in FIGS. 16 and 17. Therefore the reassembly algorithm will automatically discard the corresponding frame.

In yet further embodiments, by observing the correlations between different reconstructed signals (31 of them in FIG. 17), one can correct for clock deviations between transmitter and receiver. If all clocks are in perfect synchronism (assuming perfect knowledge of Tm and Tframe), these different reconstructed signals will be perfectly aligned vertically (modulo different noise effects). A clock deviation will show up as a non-zero shift of the best correlation. In this manner, the receiver can adapt to the transmitter clock. It turns out that this method works, even if the received signal is heavily corrupted by the ISI caused by the exposure time of the camera.

The minimum number of frames required in order to get a complete reassembly is now discussed.

Consider again what happens to covering a message with footprints if:

relative footprint α=Tfootprint/Tf=0.4

0<α≤1, (in practice e.g. 0<α≤0.88 due to hidden lines)

Figure 18:
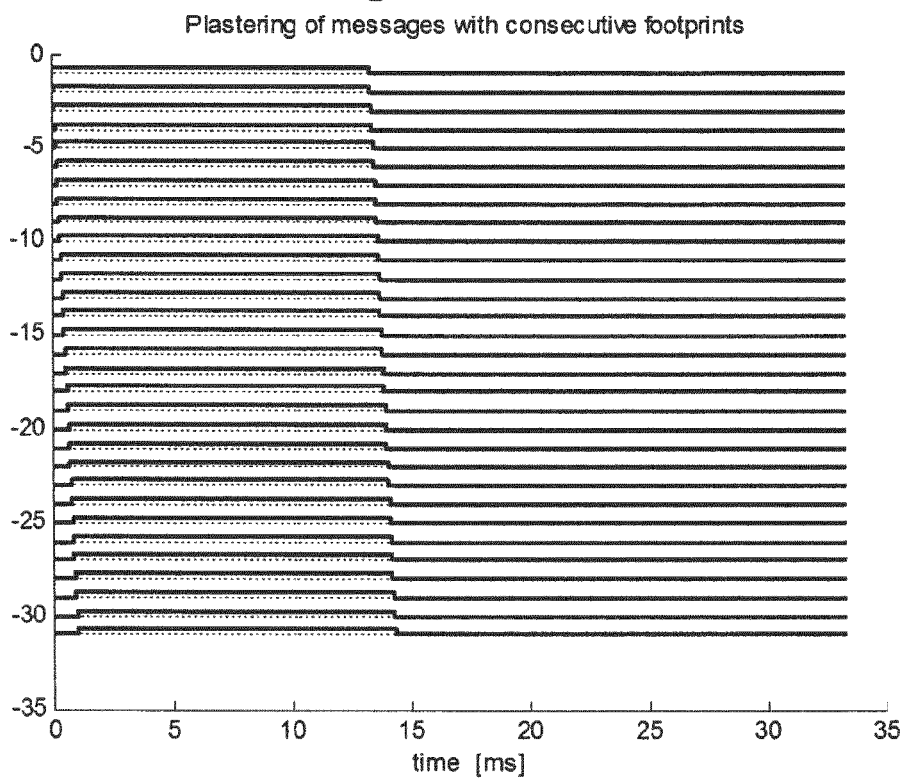
FIG. 18 shows a non-rolling alignment of messages.

If Tm is about Tframe, the alignment of the messages looks like FIG. 18.

Figure 19:
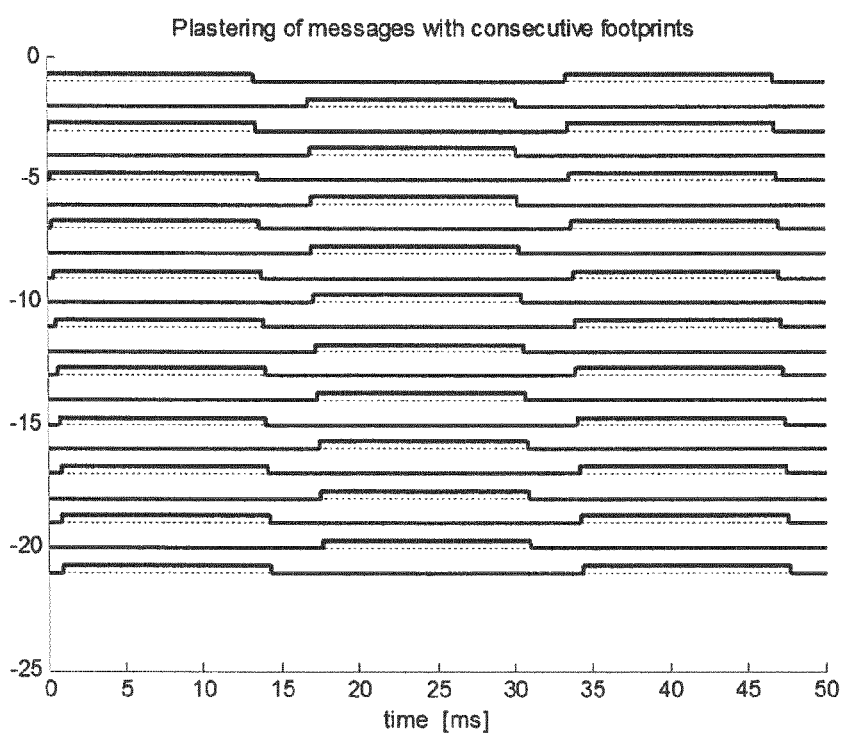
FIG. 19 shows a "switching" alignment of messages.

If Tm is about 1.5 times Tframe, the alignment of the messages looks like FIG. 19.

It turns out that, if α<1, one obtains "non-rolling" footprints if the message durations Tm are a multiple of the frame duration Tf. If α<0.5, one obtains "switching" footprints if Tm is a half-integer multiple of Tf (0.5, 1.5, 2.5, . . . ).

As discussed previously in relation to FIG. 8, in general, if 1/(n+1)<α≤1/n, where n is integer, then one has non-rolling message durations Tm if:

$$\frac{T_m}{T_f} \in \left\{ \frac{k}{m} \,\middle|\, m = 1, \ldots, n, \quad k \in N^+ \right\}$$

Note that the singularities for small m are wider than for larger m.

For a non-rolling message duration $Tm=T_0$, define $m_0$, the smallest $m$ such that $m_0 \cdot T_0 = k_0 \cdot Tframe$, as the order of the non-rolling $T_0$. $GCD(m_0, k_0)=1$ The numbers $m_0$ and $k_0$ determine the repeat pattern of footprints and messages in the neighborhood of $T_0$: about $k_0$ non-rolling footprints go into $m_0$ messages.

Consider a message of duration $Tm \sim T_0$ in the neighborhood of a non-rolling message duration $T_0$: after 1 round of $m_0$ messages, there are $k_0$ disjoint equidistant footprints partly covering the message.

The non-covered part is: $T_0 - k_0$ a Tframe, divided into $k_0$ equal parts of size Tg, where $$Tg=(T_0-k_0 \cdot Tframe \cdot \alpha)/k_0=(T_0-m_0 \cdot T_0 \cdot \alpha)/k_0 = T_0(1-m_0 \cdot \alpha)/k_0$$

FIG. 18 shows the time-alignment of messages with consecutive footprints where $\alpha=0.4$; close to $m_0=1$, $k_0=1$. Here the message does not roll significantly and each frame sees almost the same part of the message (rolling only very slowly).

FIG. 19 shows the time-alignment of messages with consecutive footprints in another case where $\alpha=0.4$; close to $m_0=2$, $k_0=3$. Here one sees "switching".

After 1 round of $m_0$ messages, there are $k_0$ gaps each of duration Tg that have to be covered by the incremental shifts of the footprints in the next rounds.

Considering the shift $\Delta T$ of footprints from one to the next round:

$$\Delta T = m0 \cdot |Tm-T0| [ms]$$

one needs $\sim 1+Tg/\Delta T$ rounds to cover the complete message $1+Tg/\Delta T$ rounds correspond to $Nf=(1+Tg/\Delta T) \cdot k_0$ frames $$N_f \approx \left(1 + \frac{T_g}{\Delta T}\right) \cdot k_0 = k_0 + \frac{T_0(1-m_0 \cdot \alpha)}{|m_0 T_m - m_0 T_0|} = k_0 + \frac{T_0(1-m_0 \cdot \alpha)}{m_0|T_m - T_0|},$$

$$m_0 \leq n$$

Note the hyperbolic behavior of Nf for Tm in neighborhood of $T_0$. Note also the effect of $m_0$ and $T_0$ on the "width" of a singularity.

Robust Wiener Filtering

This following describes another part of the decoder which in embodiments allows the above implementation to have a considerably better performance and allows the device to be used with a much wider range of cameras.

A robust Wiener filter is introduced, that can be used, e.g. for equalizing a signal that is corrupted by a filter H(f) having unknown parameters, and by additive noise. The robust Wiener is a constant filter that produces optimum results in an MSE sense, assuming that the probability distribution of the filter parameters is known.

Wiener filter theory in itself is well-known in digital signal processing, and has been used extensively since the second world war. Wiener filters can, for instance, be used for estimation of a (linearly) distorted signal in the presence of noise. A Wiener filter (equalizer) then gives the best (mean square error, MSE) result.

Figure 20:
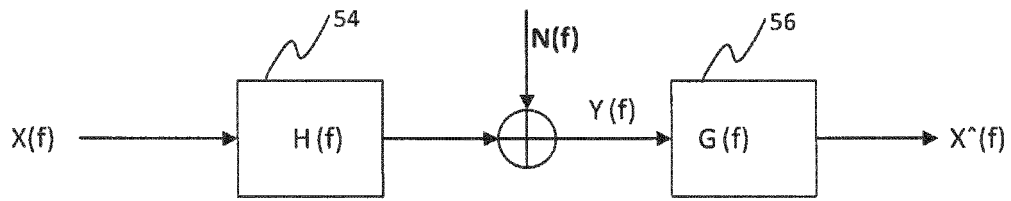
FIG. 20 is a schematic block diagram of a Wiener filter equalizing a filter H.

In classical (frequency-domain) Wiener filtering, e.g. deconvolution, one has two independent, stationary, zero mean random processes X and $N_0$ as shown in FIG. 20.

In a typical application, X represents an input signal input to a filter H (numeral 54 in FIG. 20), and $N_0$ represents additive noise added at the output of the filter H. The Wiener filter G (numeral 56) is arranged to equalize the filter H, i.e. to undo the effect of the filter H on the input signal X in presence of the noise N (to a best approximation).

A typical application is the detection of coded light with a rolling shutter camera. In this case, the equivalent digital signal processing problem corresponds to the restoration of a digital signal that has been filtered by a temporal box function. See FIG. 21. That is, the input signal X represents the coded light signal as captured by the rolling shutter camera, and the filter H represents the filtering effect of the rolling shutter acquisition process. This filter H is created by the exposure of each line. It amounts to a box function (i.e. rectangular function) in the time domain with a width Texp—i.e. a line is exposed for a time Texp in which time it captures the signal (the transfer function of the filter H in the time domain is uniformly "on"), and before and after that it does not capture any signal (the transfer function of H in the time domain is zero). A box function in the time domain corresponds to a sinc function in the frequency domain. An effect of this filter can be to produce inter-symbol interference. Hence in the following, the filter created by Texp may be referred to in terms of its unwanted effect, as an "ISI filter".

Figure 21:
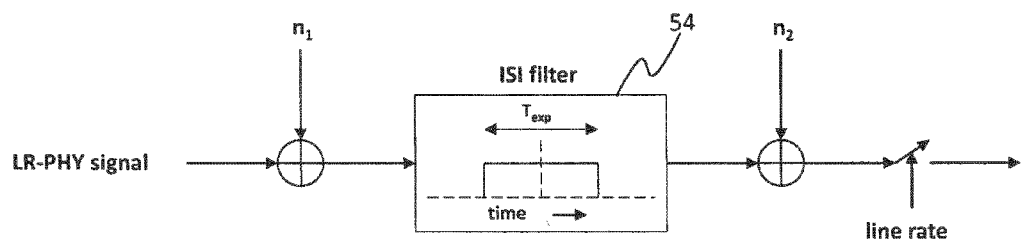
FIG. 21 is a schematic block diagram of an ISI filter resulting from a rolling shutter.
Figure 22:
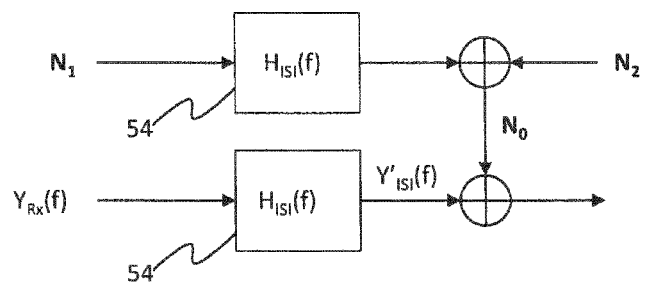
FIG. 22 is a schematic block diagram representing additive noise.

(FIGS. 21 and 22 also show how the noise $N_0$ may be considered as the sum of: (i) a noise term n1 at the input of the filter H passed through the filter H, and (i) a noise term n2 at the output of the filter H.)

The task is to find a linear filter G which provides a minimum mean square error estimate of X using only Y. To do this the Wiener filter G is preconfigured based on assumed knowledge of the filter H to be equalized (i.e. undone), as well as $N_0$. It is configured analytically such that (in theory given knowledge of H and the spectrum of X and N), applying the Wiener filter G to Y (where Y is the input signal X plus the noise N) will result in an output signal X^ that minimizes the mean square error (MSE) with respect to the original input signal X.

The classical Wiener filter formulation (in the frequency domain) is:

$$G(f) = \frac{H^*(f)S(f)}{|H(f)|^2 S(f) + N(f)}$$

where S(f) is the spectral density of the input signal X and N(f) is the spectral density of the noise term $N_0$.

As can be seen, the formulation of a Wiener filter comprises a representation of the filter to be equalized, in this case in the form of $H^*$ and $|H|^2$ $(=HH^*)$. Traditionally in the classical Wiener filter, it is assumed that H(f), the filter to be equalized, and N(f), the noise spectral density, are exactly known. In the case of equalizing for the ISI filter created by a rolling shutter acquisition process, this implies exact knowledge of Texp. It is also assumed that the spectral densities S(f) and $N_0$(f) of the processes X and N, respectively, are known.

However, Wiener filters are in fact very sensitive to errors in the estimation of H(f). Some techniques have been developed in the past to deal with an unknown distortion, such as iterative (time-consuming) approaches, where one tries to vary the target response until one gets the best result; or mini-max approaches, where one tries to identify the worst case H(f) and optimizes the Wiener filter for this.

A problem therefore in using classical Wiener filtering for equalization, is in applying this theory if the gain of the filter has to be large and the filter to be equalized is not known very accurately.

E.g. for a bandwidth of the signal is in the order of 1 kHz with Texp in the range of ⅟₃₀ of a second, the ISI filter can introduce severe inter-symbol interference (ISI) like shown in FIGS. 11 and 12.

In order to undo this ISI at the receiver side, it would be desirable to provide a "powerful" equalizer filter that is insensitive to inaccuracies in the definition of H(f).

According to the present disclosure, this can be achieved by computing a fixed "average Wiener filter", a Wiener-like filter that is robust under unknown variations of the ISI filter H(f). This "robust Wiener filter" can produces a more optimal output in terms of MSE, given a statistical distribution of the relevant parameters of H(f).

In an application to coded light, this theory allows one to reconstruct a coded light signal where Texp of the camera is only known approximately, which can often be the case.

The inventors have found a particularly efficient derivation of an optimal robust Wiener filter. In the following the problem is described in the frequency domain (so in terms of H(f), as introduced before). Note that in an application to coded light, the robust Wiener filter may be constructed in real time in a camera-based (smart phone) decoding algorithm, as Texp, and therefore H(f), is defined or changed during the actual read-out of a lamp.

The robust Wiener filtering is based on noting that H(f) is not known exactly, but may in fact be dependent on at least one unknown quantity θ, i.e. a parameter of H whose value is not known and may in fact in any given case be found within a range of values, e.g. between two limits −Δ and +Δ (or more generally Δ1 and Δ2). That is, it is assumed that the filter H(f;θ) depends on a random parameter θ, independent of X and N.

For a box function of width θ, i.e. a sin c in the frequency domain, one may write:

$$H(f;\theta) = \frac{\sin(\pi\theta f)}{\pi\theta f}$$

And in the case of an ISI filter created by the box, θ is Texp.

The robust Wiener filter 56' is then created by taking the classical Wiener filter representation given above, and where a representation of the filter to be equalized appears, replacing with a corresponding averaged representation that is averaged over the potential values of the unknown parameter θ (e.g. average between −Δ and +Δ or more generally Δ1 and Δ2). That is, wherever a term based on H(f) appears, this is replaced with an equivalent averaged term averaged with respect to θ.

Figure 23:
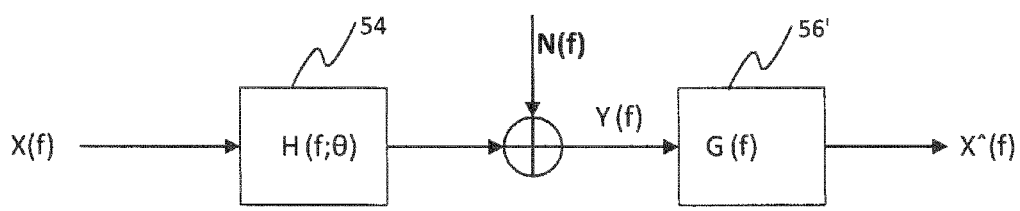
FIG. 23 is a schematic block diagram of a robust Wiener filter equalizing a filter H.

Starting from the classical formulation above, this gives:

$$G = \frac{E_\theta[H^*] \cdot S}{E_\theta[HH^*] \cdot S + \mathcal{N}_0}$$

where E is the average with respect to θ. See also FIG. 23.

A derivation of this is now explained in further detail. It is desired to find a fixed linear filter G that provides a linear minimum mean square error estimate $$\hat{X}(f) = G(f)Y(f)$$

such that $$e(f) = E_{X,N,\theta}[(X(f) - \hat{X}(f))^2]$$

is minimal.

Extending the classical derivation by taking also the ensemble average with respect to θ, one obtains:

$$e = E_{X,N,\theta}[|X - \hat{X}|^2]$$

$$= E_{X,N,\theta}[|X - G(HX + N)|^2]$$

$$= E_{X,N,\theta}[|(1 - GH)X - GN|^2]$$

$$= E_\theta[(1 - GH)(1 - GH)^*] \cdot E[|X|^2] + GG^* \cdot E[|N|^2]$$

since X, N and θ are independent and $$E[X] = E[N] = 0$$

$$= E_\theta[(1 - GH)(1 - GH)^*] \cdot S + GG^* \cdot \mathcal{N}_0$$

$$= \{1 - G \cdot E_\theta[H] - G^* \cdot E_\theta[H^*] + GG^* \cdot E_\theta[HH^*]\} \cdot S + GG^* \cdot \mathcal{N}_0$$

The best G(f) is found by differentiating e to G and setting the result to 0:

$$\frac{\partial}{\partial G} e = \{-E_\theta[H] + G^* \cdot E_\theta[HH^*]\} \cdot S + G^* \cdot \mathcal{N}_0 = 0$$

from which one obtains:

$$G = \frac{E_\theta[H^*] \cdot S}{E_\theta[HH^*] \cdot S + \mathcal{N}_0}$$

In a similar manner, one can incorporate a target response of a matched filter (MF):

$$G = \frac{H_{MF} \cdot E_\theta[H^*] \cdot S}{E_\theta[HH^*] \cdot S + \mathcal{N}_0}$$

To apply this there remains the computation of $E_\theta[H^*]$ and $E_\theta[HH^*]$. Some examples are given below.

A first approach is to use a Taylor series expansion of H and moments of θ. In the coded light rolling shutter application θ=Texp.

$$E[\theta] = \hat{\theta}$$

$$E[(\theta - \hat{\theta})^2] = \sigma_\theta^2$$

$$H'(f;\hat{\theta}) = \frac{\partial}{\partial \theta} H(f,\theta)\bigg|_{\theta=\hat{\theta}} \quad H''(f;\hat{\theta}) = \frac{\partial^2}{(\partial\theta)^2} H(f,\theta)\bigg|_{\theta=\hat{\theta}}$$

A Taylor series expansion gives:

$$H(f;\theta) = H(f;\hat{\theta}) + (\theta - \hat{\theta})H'(f;\hat{\theta}) + (\theta - \hat{\theta})^2 \frac{H''(f;\hat{\theta})}{2} + O(\theta - \hat{\theta})^3$$

$$E_\theta[H(f;\theta)] = H(f;\hat{\theta}) + H'(f;\hat{\theta})E_\theta[\theta - \hat{\theta}] + \frac{H''(f;\hat{\theta})}{2} E_\theta[(\theta - \hat{\theta})^2] + O(\theta - \hat{\theta})^3$$

$$= H(f;\hat{\theta}) + \frac{H''(f;\hat{\theta})}{2}\sigma_\theta^2 + O(\theta - \hat{\theta})^3$$

$$E_\theta[H(f;\theta)H^*(f;\theta)] = H(f;\hat{\theta})H^*(f;\hat{\theta}) + (H'(f;\hat{\theta})H'^*(f;\hat{\theta}) + \text{Re}\{H(f;\hat{\theta})H''^*(f;\hat{\theta})\}) \cdot \sigma_\theta^2 + O(\theta - \hat{\theta})^3$$

In the rolling shutter application:

$$H(f;\theta) = \frac{\sin(\pi\theta f)}{\pi\theta f}$$

Then:

$$\frac{\partial}{\partial\theta}H(f;\theta) = \frac{1}{\theta}\left\{\cos(\pi\theta f) - \frac{\sin(\pi\theta f)}{\pi\theta f}\right\}$$

$$\frac{\partial^2}{(\partial\theta)^2}H(f;\theta) = \frac{2}{\theta^2}\left\{\frac{\sin(\pi\theta f)}{\pi\theta f} - \cos(\pi\theta f)\right\} - \frac{\pi f}{\theta}\sin(\pi\theta f)$$

This approach works better for low frequencies since H"(f,θ) blows up with increasing frequency.

A second approach is to use a more exact computation assuming a known distribution of θ. Example: θ is uniform distributed between $\hat{\theta}-\Delta$, and $\hat{\theta}+\Delta$, and $$H(f;\theta) = \frac{\sin(\pi\theta f)}{\pi\theta f}.$$

Then:

$$E_\theta[H(f;\theta)] = \int_{\hat{\theta}-\Delta}^{\hat{\theta}+\Delta} \frac{\sin(\pi f\theta)}{\pi f\theta} d\theta$$

$$\approx \frac{-1}{\hat{\theta}} \frac{1}{(\pi f)^2}\{\cos\pi f(\hat{\theta}+\Delta) - \cos\pi f(\hat{\theta}-\Delta)\}\frac{1}{2\Delta},$$

$$\Delta << \hat{\theta}.$$

$$E_\theta[H(f;\theta)H^*(f;\theta)] = \int_{\hat{\theta}-\Delta}^{\hat{\theta}+\Delta} \frac{\sin^2(\pi f\theta)}{(\pi f\theta)^2} d\theta$$

$$\approx \frac{1}{4\Delta(\pi f\hat{\theta})^2}\cdot\left\{2\Delta - \frac{\sin(2\pi f\theta)}{2\pi f}\right\}\Big|_{\hat{\theta}-\Delta}^{\hat{\theta}+\Delta},$$

$$\Delta << \hat{\theta}.$$

Although in embodiments the above has been described in terms of a certain modification to the classical Wiener frequency domain formulation, there may be other Wiener filter formulations (e.g. time domain or approximations of a Wiener filter, or formulations solved for a particular H) and the principle of replacing an assumed-to-be-known H or function of with an average H or function of H may also be applied in such formulations.

Note also the robust Wiener filter disclosed herein can be used to equalize other filters other than a box (rectangular) filter, and/or in other applications other than receiving coded light. Another example is a band pass filter having a center frequency $f_0$ which may not be exactly known. In this case the filter to be equalized is a function of frequency f and center frequency $f_0$, $H(f; f_0)$, and the robust Wiener filter is determined from an averaged representation of $H(f; f_0)$ averaged with respect to $f_0$. E.g.:

$$G = \frac{E_{f0}[H^*]\cdot S}{E_{f0}[HH^*]\cdot S + N_0}$$

Further, the idea of the robust Wiener filter can also be extended to a higher dimensional theta, i.e. more than one parameter may be allowed to be uncertain. In this case the representation of filter H to be equalized (e.g. H* and HH*) is averaged over each of the unknown quantities. For example, the parameters may be the center frequency and/or band width of a band pass filter.

Further, the noise term $N_0$ could alternatively or additionally represent the spectral density of an interfering signal. A generic term for noise and/or interference is "disturbance".

It will be appreciated that the above embodiments have been described only by way of example. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored and/or distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A device adapted to provide a coded light signal to a rolling-shutter camera, comprising:
    a driver for controlling a light source based on a controller output to embed the coded light signal into visible light emitted from the light source for reception by the camera, the camera being configured to capture frames by exposing a plurality of lines of each frame in sequence, the camera having an exposure time being the time for which each line is exposed; and
    a controller configured to generate the controller output to generate the coded light signal according to a format whereby the coded light signal comprises at least one message and the message is repeated multiple times with a timing that is configured relative to the exposure time of the camera; wherein:
    the message is of a duration longer than an amount of time for capturing one frame, wherein a different part of the message is emitted during different captured frames; and
    the message comprises one or more packets comprising different data content, wherein each of the packets of the message is followed by an inter-packet idle period, and wherein the repetitions of the message are separated by an inter-message idle period different than the inter-packet idle period.

2. The device of claim 1, wherein the message is repeated such that the whole message will be emitted over a plurality of frames.

3. The device of claim 1, wherein said number of lines is less than or equal to 14% of the lines of each frame.

4. A system comprising the device of claim 1, the light source, and the camera.

5. The device of claim 1, wherein the inter-packet idle period is greater than or equal to the exposure time or a maximum anticipated value of the exposure time.

6. The device of claim 1, wherein the inter-message idle period is selected to obtain said timing whereby a different part of the message is emitted in each of a plurality of different ones of said frames.

7. The device of claim 1, wherein the exposure time is less than or equal to (1/30)s, less than or equal to (1/60)s, or less than or equal to (1/120)s.

8. The device of claim 1, wherein the at least one message is formed of at least three packets per message.

9. The device of claim 1, wherein each of the packets is of a length less than or equal to 17 bits long, less than or equal to 12 bits long, or less than or equal to 9 bits long.

10. The device of claim 9, wherein the packet length is 9 bits, consisting of a byte of content and a synchronization bit.

11. The device of claim 10, wherein the controller is configured to encode the coded light signal with a symbol rate of said symbols being 1 kHz, 2 kHz or 4 kHz.

12. The device of claim 1, wherein the controller is configured to encode the coded light signal according to a ternary Manchester modulation coding scheme whereby data bits of the signal are represented by being mapped to ternary Manchester symbols.

13. The device of claim 12, wherein the inter-message idle period has a duration of at least 4 of said symbols.

14. The device of claim 13, wherein each of the packets is 19 of said symbols long, the inter-packet idle period has a duration of 33 of said symbols, and the inter-message idle period has a duration of 5 of said symbols.

15. The device of claim 1, wherein the controller is configured to receive an indication of the exposure time from the camera, and to adapt the format of the message based on the exposure time.

16. The device of claim 15, wherein the controller is configured to perform said adaptation by selecting one of more parameters such that a different part of the message is emitted in each of a plurality of different ones said frames, the one or more parameters comprising: the inter-packet idle period, inter-message idle period, number of packets per message, and/or symbol rate.

17. The device of claim 16, wherein the controller is configured to adapt the format by selecting between a plurality of different predetermined combinations of said parameters.

18. A method for providing a coded light signal to a rolling-shutter camera, comprising:
controlling a light source to embed the coded light signal into visible light emitted from the light source for reception by the camera, the camera being configured to capture frames by exposing a plurality of lines of each frame in sequence, the camera having an exposure time being the time for which each line is exposed; and
generating the coded light signal according to a format whereby the coded light signal comprises at least one message and the message is repeated multiple times with a timing that is configured relative to the exposure time of the camera; wherein:
the message is of a duration longer than an amount of time for capturing one frame, wherein a different part of the message is emitted during different captured frames; and
the message comprises one or more packets comprising different data content, wherein each of the packets of the message is followed by an inter-packet idle period, and wherein the repetitions of the message are separated by an inter-message idle period different than the inter-packet idle period.

19. A computer program product comprising code embodied on a computer-readable storage medium and configured so as, when executed on a device comprising a driver for controlling a light source based on a controller output to provide a coded light signal to a rolling-shutter camera, to perform operations of:
controlling the light source based on the controller output to the driver to embed the coded light signal into visible light emitted from the light source, to be received by the camera, the camera being configured to capture frames by exposing a plurality of lines of each frame in sequence, the camera having an exposure time being the time for which each line is exposed; and
generating the controller output for output to the driver to generate the coded light signal according to a format whereby the coded light signal comprises at least one message and the message is repeated multiple times with a timing that is configured relative to the exposure time of the camera; wherein:
the message is of a duration longer than an amount of time for capturing one frame, wherein a different part of the message is emitted during different captured frames; and
the message comprises one or more packets comprising different data content, wherein each of the packets of the message is followed by an inter-packet idle period, and wherein the repetitions of the message are separated by an inter-message idle period different than the inter-packet idle period.

* * * * *